US012652870B2

(12) United States Patent
Fossum et al.

(10) Patent No.: US 12,652,870 B2
(45) Date of Patent: Jun. 9, 2026

(54) MULTIGATE IN-PIXEL SOURCE FOLLOWER

(71) Applicant: TRUSTEES OF DARTMOUTH COLLEGE, Hanover, NH (US)

(72) Inventors: Eric R. Fossum, Hanover, NH (US); Wei Deng, Hanover, NH (US)

(73) Assignee: TRUSTEES OF DARTMOUTH COLLEGE, Hanover, NH (US)

( * ) Notice: Subject to any disclaimer, the term of this patent is extended or adjusted under 35 U.S.C. 154(b) by 334 days.

(21) Appl. No.: 18/555,834

(22) PCT Filed: Apr. 19, 2022

(86) PCT No.: PCT/US2022/025372
§ 371 (c)(1),
(2) Date: Oct. 17, 2023

(87) PCT Pub. No.: WO2022/225948
PCT Pub. Date: Oct. 27, 2022

(65) Prior Publication Data
US 2024/0213289 A1 Jun. 27, 2024

Related U.S. Application Data

(60) Provisional application No. 63/176,714, filed on Apr. 19, 2021.

(51) Int. Cl.
*H01L 27/146* (2006.01)
*H04N 25/77* (2023.01)
(Continued)

(52) U.S. Cl.
CPC ............. *H10F 39/18* (2025.01); *H04N 25/77* (2023.01); *H10F 39/8037* (2025.01)

(58) Field of Classification Search
CPC ........... H03F 2203/45514; H03F 3/087; H03F 3/45475; H04N 25/76; H04N 25/77; H10F 39/18; H10F 39/8037
See application file for complete search history.

(56) References Cited

U.S. PATENT DOCUMENTS 5,587,668 A * 12/1996 Shibata ................. G06F 7/5013
326/119
5,719,520 A 2/1998 Au et al.
(Continued)

OTHER PUBLICATIONS

International Search Report Issued Aug. 1, 2022, in PCT/US2022/025372, filed on Apr. 19, 2022, 3 pages.
(Continued)

*Primary Examiner* — Jaehwan Oh
(74) *Attorney, Agent, or Firm* — Oblon, McClelland, Maier & Neustadt, L.L.P.

(57) ABSTRACT

An image sensor including one or more pixels is provided. At least one of the pixels can include a semiconductor substrate, a floating diffusion formed in the semiconductor substrate, a transfer gate configured to selectively cause transfer of photo-charges stored in the pixel to the floating diffusion, and a multigate source follower. The multigate source follower can include a channel, a source and a drain coupled by the channel, a modulation gate formed over the channel and coupled to the floating diffusion, and a first guard gate formed over the channel.

20 Claims, 19 Drawing Sheets

200

(51) Int. Cl.
  *H10F 39/00*          (2025.01)
  *H10F 39/18*          (2025.01)

(56)                    References Cited

U.S. PATENT DOCUMENTS

2014/0299747  A1 *  10/2014  Tachino ............. H10F 39/8057
                                                      257/229
2023/0395621  A1 *  12/2023  Lim ................... H10F 39/8037

OTHER PUBLICATIONS

Written Opinion Issued Aug. 1, 2022, in PCT/US2022/025372, filed
on Apr. 19, 2022, 6 pages.

* cited by examiner

600

GG1 640a    MG 650    GG1 640b

N 630

N+ 620a (S)    N+ 620b (D)

P SUB 610

600b

VDD    VDD    COL 108

RG 104

TG 103

FD 105

GG 1

GG 2

SF 600

N+

N SW    102

101

RS 107

P SUB

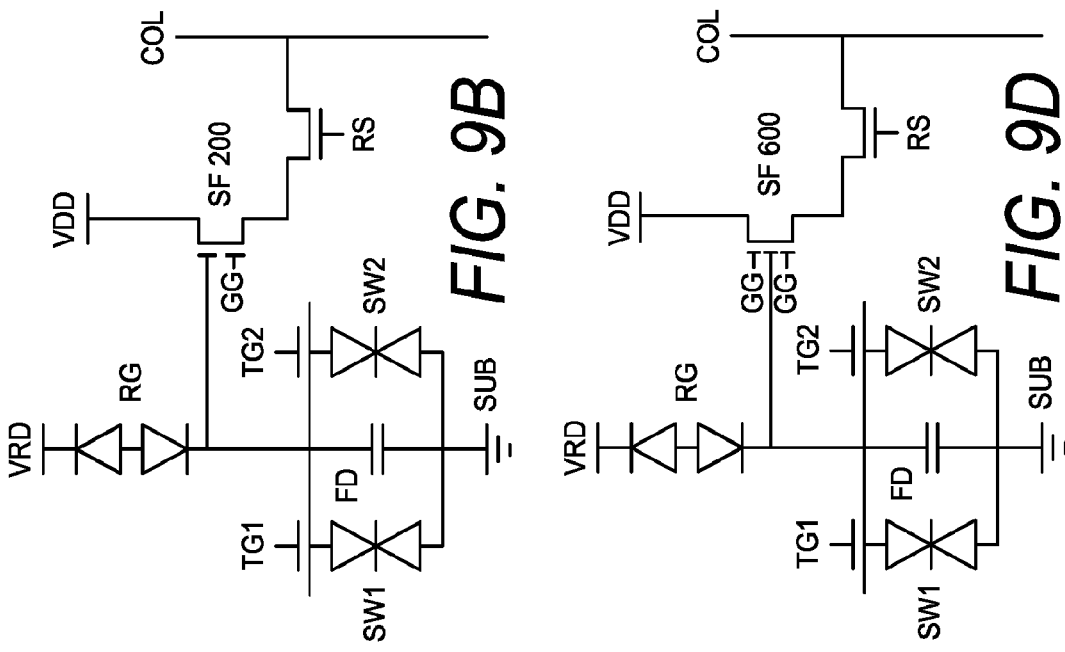
*FIG. 9A*
*FIG. 9B*
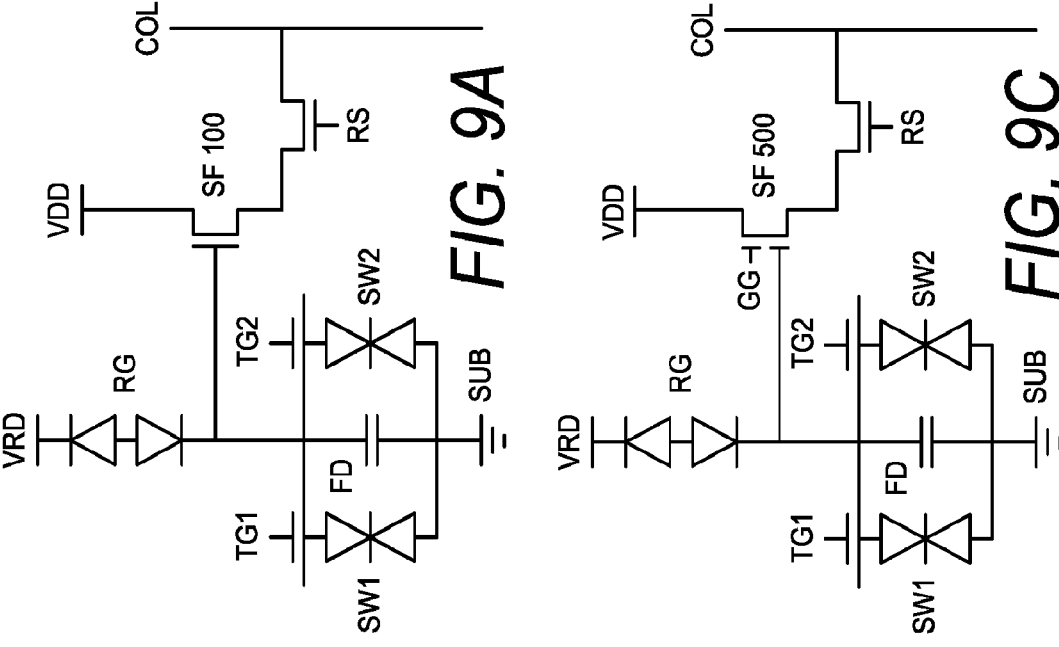
*FIG. 9C*
*FIG. 9D*

*FIG. 12A*
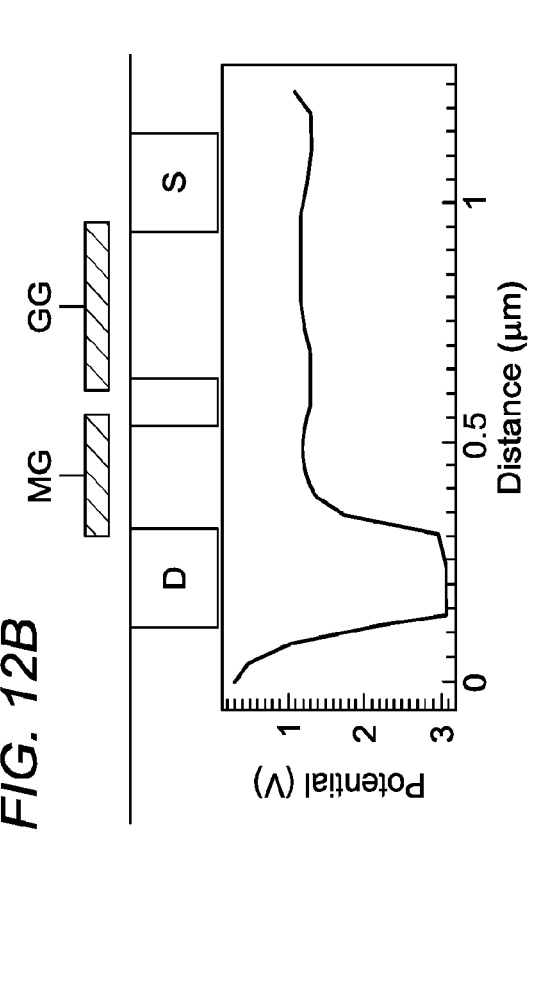
*FIG. 12B*
*FIG. 12C*
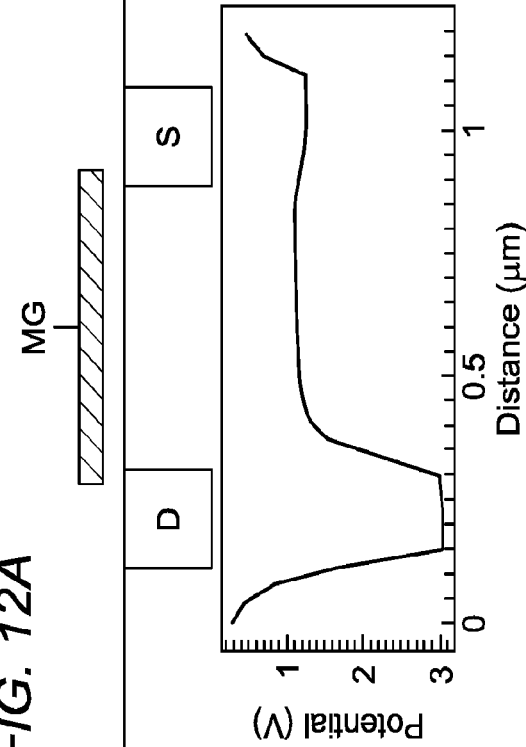
*FIG. 12D*
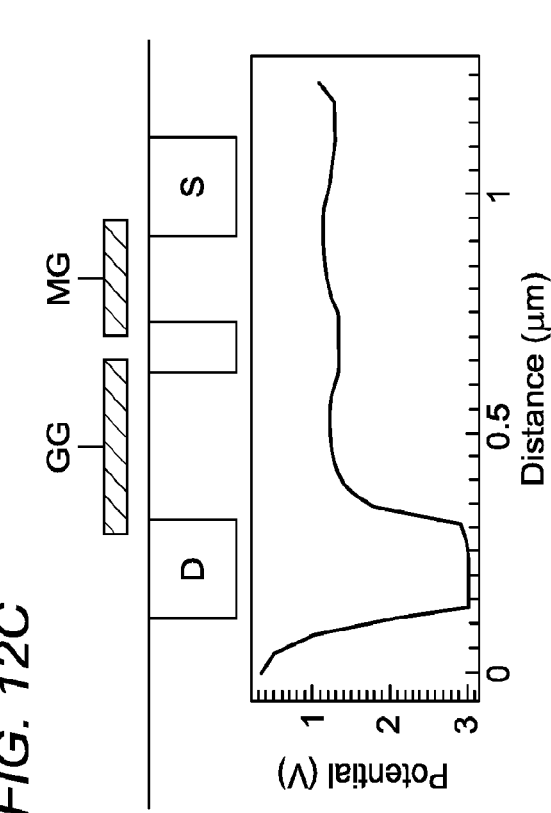

MULTIGATE IN-PIXEL SOURCE FOLLOWER

CROSS-REFERENCE TO RELATED APPLICATIONS

The present application claims the benefit of priority to U.S. Provisional Application No. 63/176,714, entitled "SOURCE FOLLOWER WITH REDUCED NOISE," filed on Apr. 19, 2021, which is incorporated herein by reference in its entirety.

BACKGROUND

Field of the Disclosure

The present disclosure relates to image sensors, and, more particularly, to multigate source followers (MGSFs) applied to the image sensors.

Description of the Related Art

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

Image sensors have become ubiquitous. For example, they can be used in cellular phones, medical, security cameras, etc. In addition to the conventional CMOS image sensor (CIS), the Quanta Image Sensor (QIS) has been proposed as a possible next-generation image sensor. In the single-bit QIS, the specialized, sub-diffraction-limit (SDL) sized binary-output photo-element sensitive to a single photoelectron is called a "jot."

In-pixel source follower (SF), $1/f$ noise dominates the read noise of CISs and QISs. Generally, $1/f$ noise scales with transistor gate area. For example, an SF with a larger gate area has a lower $1/f$ noise. However, a large gate area will lead to a large gate parasitic capacitance, which will reduce the conversion gain (CG) of the pixel. In order to achieve a high CG, a small gate area is desired. Due to this tradeoff between $1/f$ noise and CG, the floating diffusion (FD)-referred read noise can only achieve a theoretical minimum level with an optimum SF size.

SUMMARY

Aspects of the present disclosure provide an image sensor including one or more pixels. For example, at least one of the pixels can include a semiconductor substrate, a floating diffusion formed in the semiconductor substrate, a transfer gate configured to selectively cause transfer of photo-charges stored in the pixel to the floating diffusion, and a multigate source follower. The multigate source follower can include a channel, a source and a drain coupled by the channel, a modulation gate formed over the channel and coupled to the floating diffusion, and a first guard gate formed over the channel and spaced apart from the modulation gate.

In an embodiment, the first guard gate can be located closer than the modulation gate to the source. In another embodiment, the first guard gate can be located closer than the modulation gate to the drain. In some other embodiments, the modulation gate can have a smaller area than the first guard gate.

In an embodiment, the multigate source follower can further include a second guard gate formed over the channel and spaced apart from the modulation gate, and the modulation gate is located between the first guard gate and the second guard gate. In another embodiment, the modulation gate can have a smaller area than the second guard gate.

In an embodiment, the multigate source follower can be buried-channel. In another embodiment, the multigate source follower can be surface-channel.

In an embodiment, the pixel can further include a gated reset transistor coupled to the floating diffusion. In another embodiment, the pixel can further include a gateless reset diode coupled to the floating diffusion.

In an embodiment, the image sensor can be a quanta image sensor (QIS). In another embodiment, the image sensor can be a complementary metal-oxide-semiconductor (CMOS) active pixel image sensor. In some other embodiments, the image sensor can be included in a camera. In various embodiments, the first guard gate can be spaced apart from the modulation gate at a distance less than 0.05 μm.

In an embodiment, the first guard gate is spaced apart from the modulation gate at a distance less than 5×a mean free path of an electron in a channel under normal operating conditions.

In an embodiment, the pixel can further include a pinned photodiode configured for storing the photo-charges.

Aspects of the present disclosure also provide a method. For example, the method can include providing an image sensor including one or more pixels. At least one of the pixels can include a semiconductor substrate, a floating diffusion formed in the semiconductor substrate, a transfer gate configured to selectively cause transfer of photo-charges stored in the pixel to the floating diffusion, and a multigate source follower. The multigate source follower can include a channel, a source and a drain coupled by the channel, a modulation gate formed over the channel and coupled to the floating diffusion, and a first guard gate formed over the channel and spaced apart from the modulation gate. The method can further include connecting the source of the multigate source follower to a bit line directly.

Aspects of the present disclosure also provide a multigate source follower for at least one of one or more pixels of an image sensor. For example, the multigate source follower can include a semiconductor substrate, a channel formed in the semiconductor substrate, a source and a drain formed in the semiconductor substrate and coupled by the channel, a modulation gate formed over the channel, and a first guard gate formed over the channel and spaced apart from the modulation gate.

In an embodiment, the modulation gate can have a smaller area than the first guard gate. In another embodiment, the multigate source follower can further include a second guard gate formed over the channel and spaced apart from the modulation gate, wherein the modulation gate is located between the first guard gate and the second guard gate.

The foregoing paragraphs have been provided by way of general introduction, and are not intended to limit the scope of the following claims. The described embodiments, together with further advantages, will be best understood by reference to the following detailed description taken in conjunction with the accompanying drawings.

DESCRIPTION OF THE DRAWINGS

A more complete appreciation of the disclosure and many of the attendant advantages thereof will be readily obtained as the same becomes better understood by reference to the following detailed description when considered in connection with the accompanying drawings, wherein:

FIGS. 9A to 9D are schematic views of the SFs shown in FIGS. 1, 2, 5A, and 6A, respectively, which are applied to shared readout pixels;

FIGS. 12A to 12D show electrostatic potentials along channels of the SFs shown in FIGS. 1, 2, 5A, and 6A, respectively;

DETAILED DESCRIPTION

The terms "a" or "an", as used herein, are defined as one or more than one. The term "plurality", as used herein, is defined as two or more than two. The term "another", as used herein, is defined as at least a second or more. The terms "including" and/or "having", as used herein, are defined as comprising (i.e., open language). Reference throughout this document to "one embodiment", "certain embodiments", "an embodiment", "an implementation", "an example" or similar terms means that a particular feature, structure, or characteristic described in connection with the embodiment is included in at least one embodiment of the present disclosure. Thus, the appearances of such phrases or in various places throughout this specification are not necessarily all referring to the same embodiment. Furthermore, the particular features, structures, or characteristics may be combined in any suitable manner in one or more embodiments without limitation.

The exemplary embodiments are described in the context of methods having certain steps. However, the methods and compositions operate effectively with additional steps and steps in different orders that are not inconsistent with the exemplary embodiments. Thus, the present disclosure is not intended to be limited to the embodiments shown, but is to be accorded the widest scope consistent with the principles and features described herein and as limited only by the appended claims.

Furthermore, where a range of values is provided, it is to be understood that each intervening value between an upper and lower limit of the range—and any other stated or intervening value in that stated range—is encompassed within the disclosure. Where the stated range includes upper and lower limits, ranges excluding either of those limits are also included. Unless expressly stated, the terms used herein are intended to have the plain and ordinary meaning as understood by those of ordinary skill in the art. Any definitions are intended to aid the reader in understanding the present disclosure, but are not intended to vary or otherwise limit the meaning of such terms unless specifically indicated.

Figure 1:
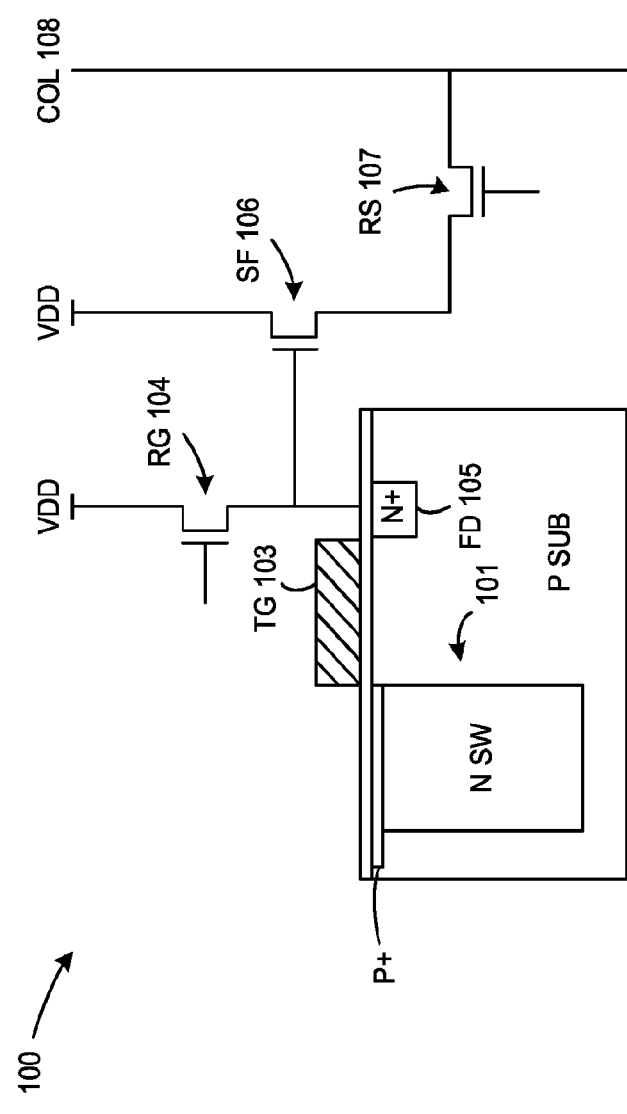
FIG. 1 shows a 4T active pixel.

FIG. 1 shows a "4T" (four transistors) active pixel 100. A light sensing element 101, such as a pinned photodiode, generates and stores photo-electrons (also called photo-charges or charges) in an N-type storage well (SW) during an integration (also referred to as exposure or accumulation) period. The pinned photodiode 101 consists of two p-n junctions: the p+/n junction close to the surface and the n/p-sub junction in the silicon bulk. The light sensing element 101 can also include a photogate, a photodiode, a pinned photodiode, a partially pinned photodiode, etc. A transfer transistor 103, which is controlled by a transfer gate (TG), transfers the charges stored in the storage well of the pinned photodiode 101 to a floating node (also referred to as a floating diffusion (FD)) 105, which is connected to the gate of a source follower (SF) 106.

In operation, during the integration period, when the transfer transistor 103 is turned off, the photodiode 101 generates and stores charges in the N-type storage well. After the integration period, a reset transistor (or referred to as a reset gate (RG)) 104 resets the FD 105 to allow correlated double sampling. Then, the transfer transistor 103 is turned on and transfers the charges stored in the N-type storage well of the photodiode 101 to the floating diffusion 105. After the charges have been transferred to the floating diffusion 105, the transfer transistor 103 is turned off again for the start of a next integration period. The charges (or voltage signals) on the floating diffusion 105 are used to modulate the SF 106. A row select transistor (RS) 107 is used to address the pixel 100 and selectively read out the signals onto a column bit line 108. After the signals are read out through the column bit line 108, the reset transistor 104 resets the floating diffusion 105 to a reference voltage above or equal to the pinning voltage, e.g., VDD, to remove any redundant charges.

The quanta image sensor (QIS) is a newly-developed photon-counting image sensor. The photoelectron counting capability is directly determined by the read noise of its photo-element, termed as jot, a specialized pixel with sub-diffraction-limit size and binary or low bit-depth output. For accurate single photoelectron counting, the target for the floating diffusion (FD) referred read noise is below ~0.15e⁻ rms. In current mainstream CMOS image sensors (CIS), the read noise is at least several times higher than this level (e.g., >0.5e⁻ rms).

1/f noise, also referred known as flicker noise, is the description of the noise from statistical fluctuations, where the power density of the noise is inversely proportional to the frequency. 1/f noise is found to be a dominant noise type in the in-pixel SF for CIS and QIS devices. 1/f noise can be reduced by correlated double sampling and correlated multiple sampling (CMS). Generally, 1/f noise scales with transistor gate area. A SF with a larger gate area has a lower 1/f noise. However, a large gate area will lead to a large gate parasitic capacitance, which will reduce the conversion gain (CG). CG is another key factor for reducing read noise when the SF output noise is referred back to the FD node. In order to achieve a large CG, the parasitic capacitance in the FD node needs to be minimized, therefore a small SF gate area is desired. Due to this tradeoff between 1/f noise and CG, the FD-referred read noise can only achieve a theoretical minimum level with an optimum SF size. A novel device that can alter the tradeoff between 1/f and CG may be desired or necessary for some implementations.

According to some aspects of the present disclosure, a multigate is introduced to the in-pixel SF to increase the total gate area for 1/f noise minimization, while the SF modulation gate (i.e., one of the multiple gates that is connected to FD) remains at the minimum size allowed so that a high CG is achieved simultaneously. The additional one or more gate(s), connected to a bias or clocked bias voltage, are referred to herein as the guard gates (GG), and in operation are preferred to be operated near the bias voltage of the modulation gate (MG), although other bias voltages are also possible.

Illustrative embodiments of image sensor pixels having a multigate SF are disclosed. Such embodiments are suited, for example, for achieving a low 1/f noise and a high CG simultaneously. Some embodiments of the present disclosure are expected to achieve a low 1/f noise similar to conventional large-size SF whose gate area is equal to the total gate area (i.e., the total area of the modulation gate and the guard gate(s)) of the multigate SF, while reducing the FD node parasitic capacitance significantly compared to the conventional SF due to the minimum size of the modulation gate.

Figure 2:
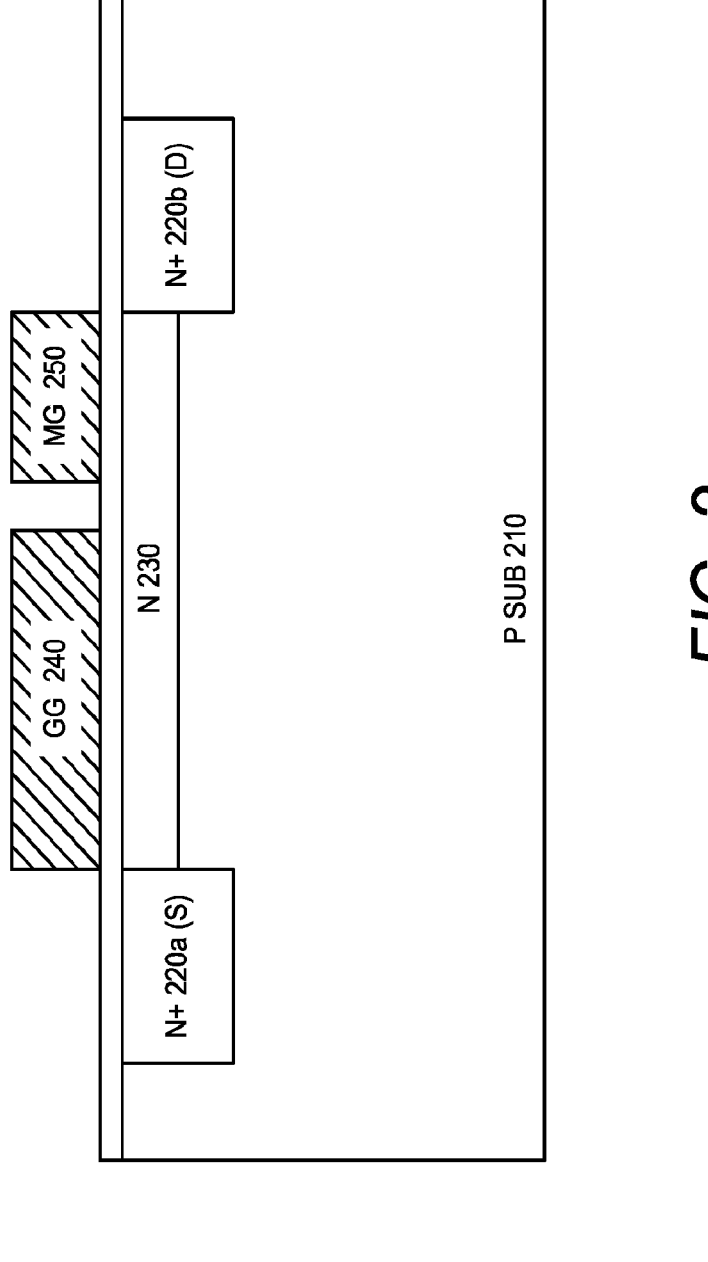
FIG. 2 schematically shows a cross-sectional view of an exemplary multigate source follower in accordance with some embodiments of the present disclosure.

FIG. 2 schematically shows a cross-sectional view of an exemplary multigate source follower (SF) 200 in accordance with some embodiments of the present disclosure. As embodiments of the present disclosure are not limited to a particular pixel configuration, for clarity, FIG. 2 focuses on the SF transistor portion of a pixel (e.g., jot) and does not show other pixel features, such as a photodiode, a transfer gate, and a reset transistor. The SF 200 can include a substrate 210, e.g., a P-type substrate, and two heavily doped N-type dopant regions (e.g., N+) 220a and 220b as source (S) and drain (D) of the SF 200, respectively. The SF 200 can be buried-channel or surface-channel. Two gates, e.g., a guard gate (GG) 240 and a modulation gate (MG) 250, are formed over a channel 230 between the source 220a and the drain 220b and spaced apart from each other. In an embodiment, the channel 230 can be a buried channel, as shown in FIG. 2, or any other type of channel. In an embodiment, the modulation gate 250 has a smaller area than the guard gate 240 in order to minimize the parasitic gate capacitance. In the example SF 200, the guard gate 240 is placed closer than the modulation gate 250 to the source 220a. In an embodiment, the guard gate can be spaced apart from the modulation gate 250 at a distance less than 0.05 μm. In another embodiment, the guard 240 gate can be spaced apart from the modulation gate 250 at a distance less than 5×a mean free path of an electron in the channel 230 under normal operating conditions.

Figure 3A:
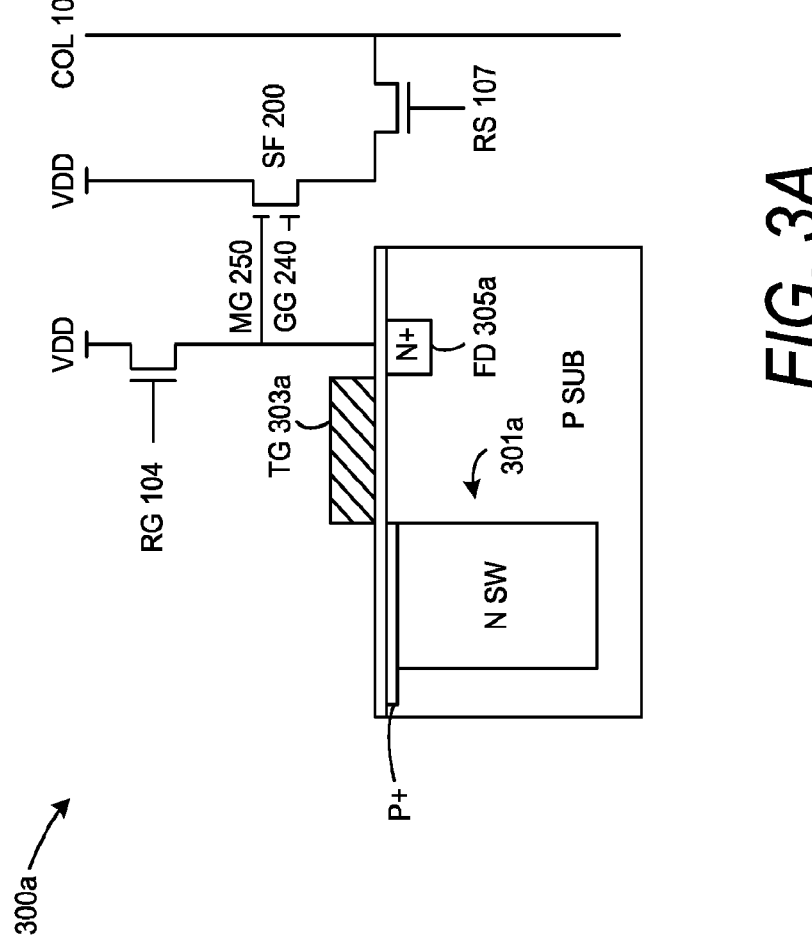
FIGS. 3A to 3C schematically show cross-sectional views of three different types of exemplary pixels that each incorporate the multigate SF shown in FIG. 2 in accordance with some embodiments of the present disclosure, and a reset transistor.
Figure 3B:
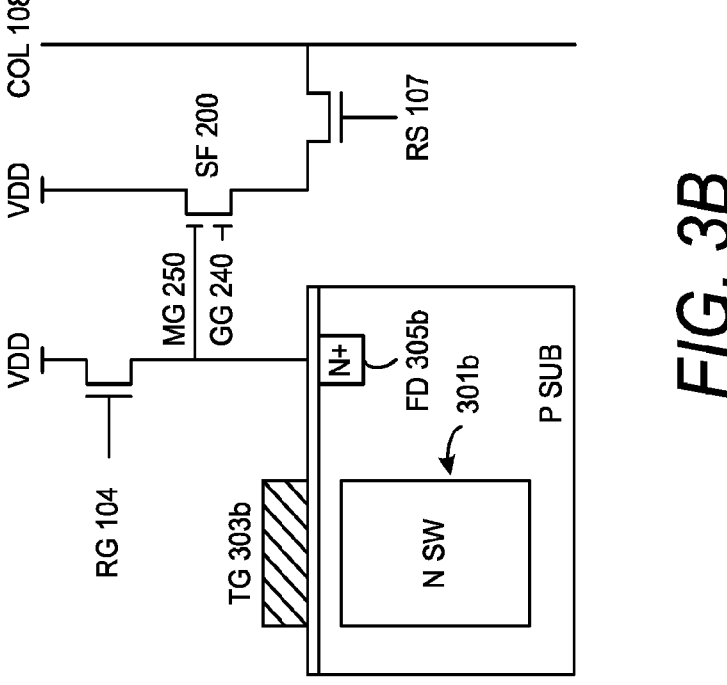
Figure 3C:
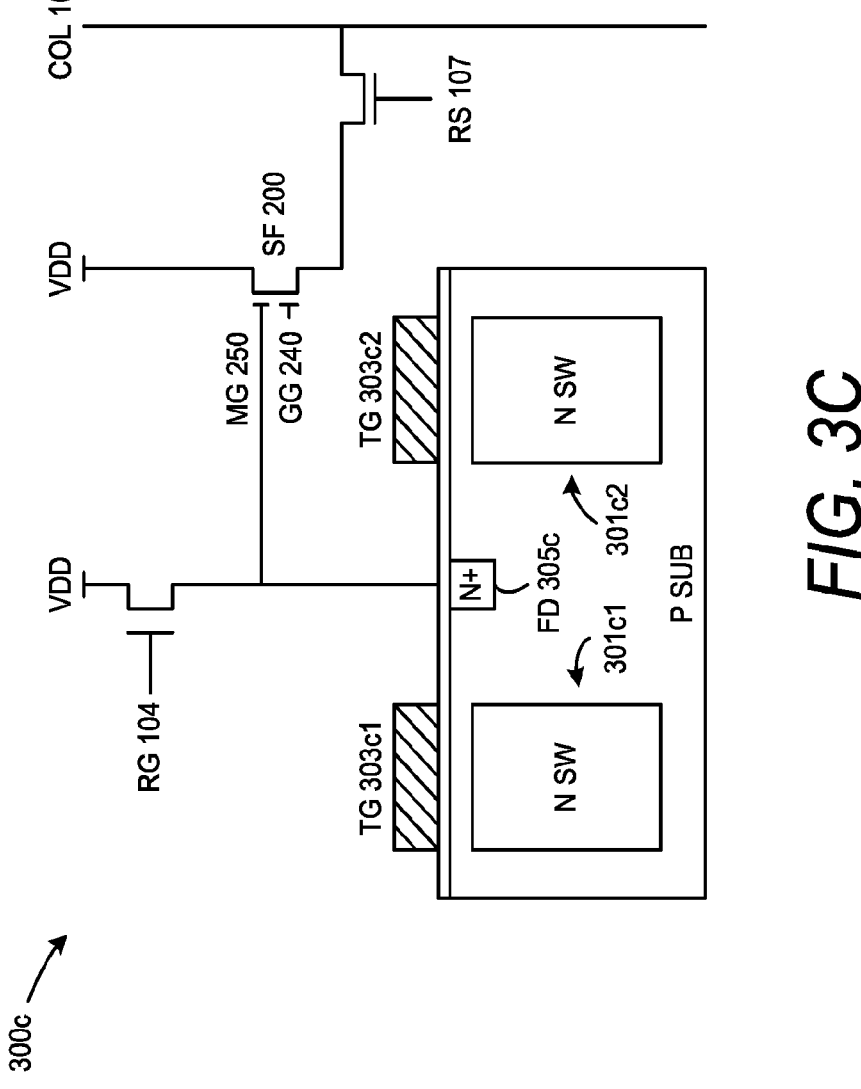

FIGS. 3A to 3C schematically show cross-sectional views of three different types of exemplary pixels 300a-300c that each incorporate a multigate SF, e.g., the SF 200, in accordance with some embodiments of the present disclosure and the reset transistor 104. In an embodiment, the reset transistor 104 can be a gateless reset diode, to further reduce FD-node capacitance, as is known to those skilled in the art. In another embodiment, the reset transistor 104 can be a gated reset transistor. The pixels 300a/300b/300c can be included in a QIS image sensor, a CMOS image sensor, a photon-counting image sensor, or a pump-gate-type photo-detector-device-based image sensor.

More specifically, FIG. 3A schematically depicts a portion of the pixel 300a having a pinned photodiode (PPD) 301a formed laterally adjacent to a transfer transistor (TG) 303a. The transfer transistor 303a can substantially or entirely overlay the pinned photodiode 301a including an N-type storage well (SW). A floating diffusion (FD) 305a is connected to the modulation gate 250 of the SF 200. The guard gate 240 can be biased at VDD. In operation, during the integration period, when the transfer transistor 303a is turned off, the pinned photodiode 301a generates and stores charges in the N-type storage well. After the integration period, the reset gate (RG) 104 resets the FD 305 to allow correlated double sampling. Then, the transfer transistor 303a is turned on and transfers the charges stored in the N-type storage well of the pinned photodiode 301a to the floating diffusion 305a. After the charges have been transferred to the floating diffusion 305a, the transfer transistor 303a is turned off again for the start of a next integration period. The guard gate 240 is biased at VDD, and the charges (or signals) on the floating diffusion 305a modulate the SF 200. The row select transistor (RS) 107 addresses the pixel 300a and selectively reads out the signals onto the column bit line 108. After the signals are read out through the column bit line 108, the reset transistor 104 resets the floating diffusion 305a to a reference voltage, e.g., VDD.

FIG. 3B schematically depicts a portion of the pixel 300b having a photodiode 301b formed beneath a transfer transistor 303b and configured as a vertical pump-gate with a floating diffusion (FD) 305b spaced away (distal) from the transfer transistor 303b so as to reduce and/or eliminate TG-FD overlap capacitance. The pixel 300b operates in the same way as the pixel 300a.

In FIG. 3C, the multigate SF 200 can also be applied to shared readout pixels, e.g., photodiodes 301ci and 301c2, to reduce pixel size compared to non-shared readout, as is well known to those skilled in the art. In operation, during the integration period, when the transfer transistors 303c1 and 303c2 are turned off, the photodiodes 301c1 and 301c2 generate and store charges in their respective N-type storage wells. After the integration period, the transfer transistors 303c1 and 303c2 are turned on and transfer the charges stored in the N-type storage wells of the photodiodes 301c1 and 202c2 to the floating diffusion 305c. After the charges have been transferred to the floating diffusion 305c, the transfer transistors 303c1 and 303c2 are turned off again for the start of a next integration period. The guard gate 240 is biased at VDD, and the charges (or signals) on the floating diffusion 305c modulate the SF 200. The row select transistor (RS) 107 addresses the pixel 300c and selectively reads out the signals onto the column bit line 108. After the signals are read out through the column bit line 108, the reset transistor 104 resets the floating diffusion 305c to a reference voltage, e.g., VDD.

Each configuration can be illuminated from the front side or back side, and either can include color and/or polarization filters (not shown) as is well known to those skilled in the art. Also well known to those skilled in the art, readout can be monolithically coupled to the pixels 300a-300c or can be configured by stacking two chips, with fully parallel, cluster parallel, or edge connections between the two chips, one with the pixels and limited electronics, and the second with additional readout electronics.

Figure 4A:
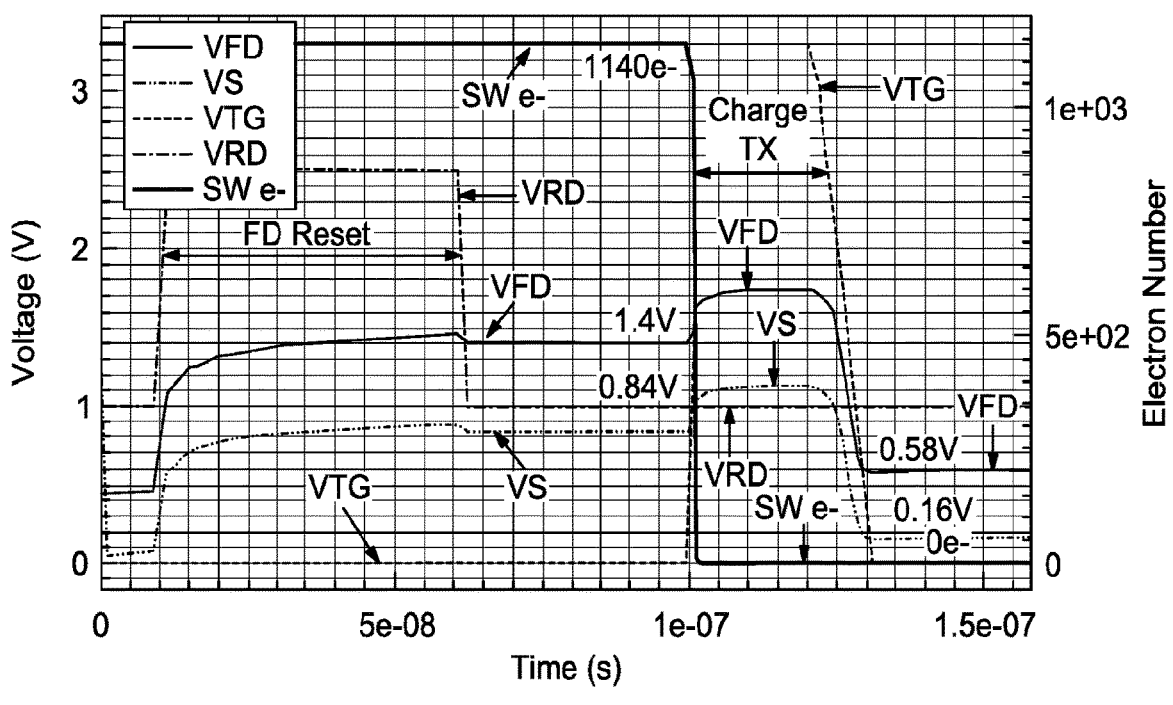
FIG. 4A shows the transient operation of a pixel with a multigate SF in accordance with some embodiments of the present disclosure.

FIG. 4A shows the transient operation of a pixel with a multigate SF, e.g., the pixel 300b with the SF 200 as depicted in FIG. 3B, but with a gateless reset diode. A voltage pulse (VRD) can be applied to the reset drain (RD) of the gateless reset transistor 104 to reset the floating diffusion 305b. In an embodiment, the voltage applied to the RD is varied between Vrdhi (e.g., 2.5V) and Vrdlo (e.g., 1.0V). After reset, the transfer gate 303b is turned on (using a voltage VTG), and the charges stored in the storage well (SW) of the photodiode 301b is transferred from the storage well (SW) to the floating diffusion 305b. The jot output, i.e., the source voltage of the multigate SF 200 (VS), follows the voltage at the floating diffusion 305b node (VFD) with a DC offset (e.g., 0.56V). More specifically, by way of non-limiting example, the guard gate 240 of the SF 200 is biased at VDD, and the modulation gate 250 of the SF 200 is connected to the floating diffusion 305b of the pixel 300b. The pixel 300b with the multigate SF 200 operates in the same way as the pixel 100 with a conventional SF, e.g., the SF 106.

Figure 4B:
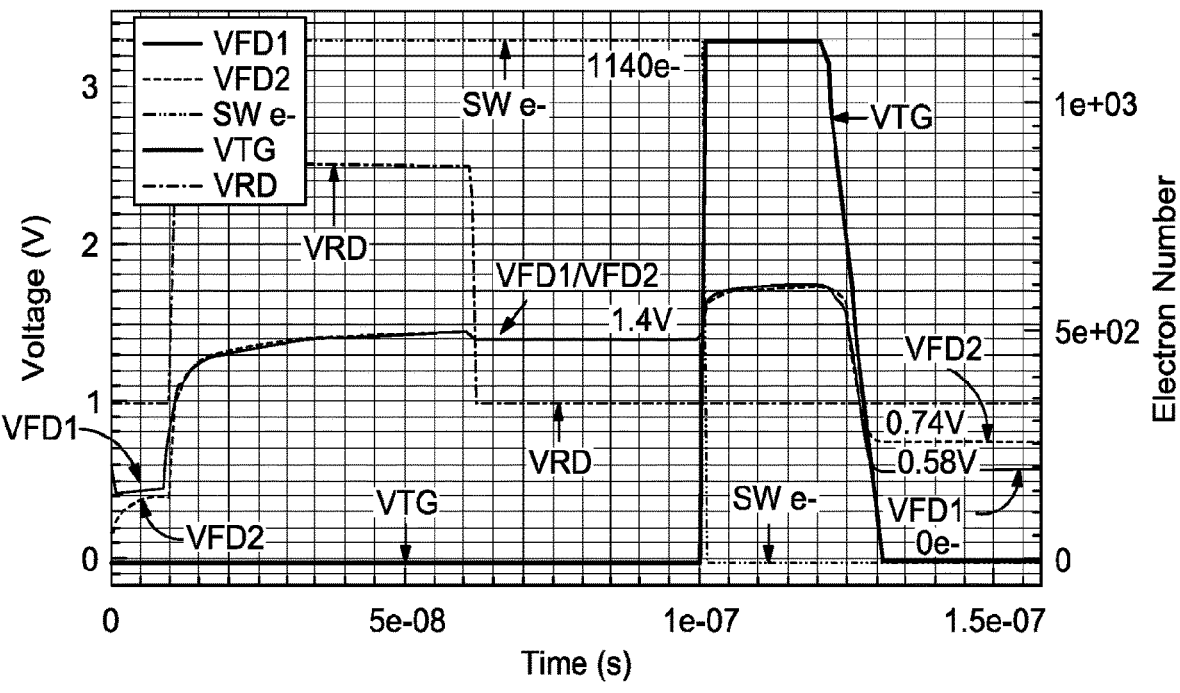
FIG. 4B shows the comparison between a pixel with a multigate SF and a pixel with a conventional SF which has the same channel area.

Multigate SF according to some embodiments of the present disclosure may be further understood through the comparison between a pixel with a multigate SF and a pixel with a conventional SF that has the same channel area, as shown in FIG. 4B. The two SFs in this comparison are expected to have similar 1/f noise due to the same channel area. However, the FD-referred conversion gain (CG) of the pixel with a multigate SF, e.g., the SF 200, is much higher (e.g., 719 $\mu$V/e$^-$ for a pixel with the multigate SF vs. 579 $\mu$V/e$^-$ for a pixel with a conventional SF), due to the small modulation gate area and thus reduced FD parasitic capacitance. Therefore, the FD voltage (VFD1) of the pixel with a multigate SF is smaller than the FD voltage (VFD2) of the pixel with a conventional SF (e.g., 0.58V vs. 0.74V) after charge transfer.

Figure 5A:
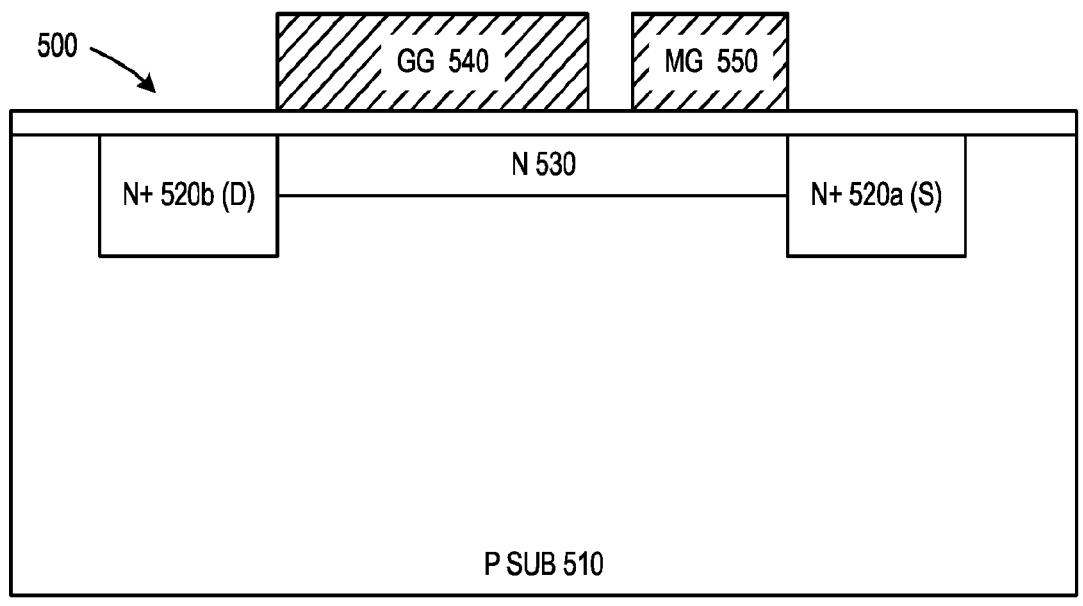
FIG. 5A schematically shows a cross-sectional view of an exemplary multigate source follower in accordance with some embodiments of the present disclosure.
Figure 5B:
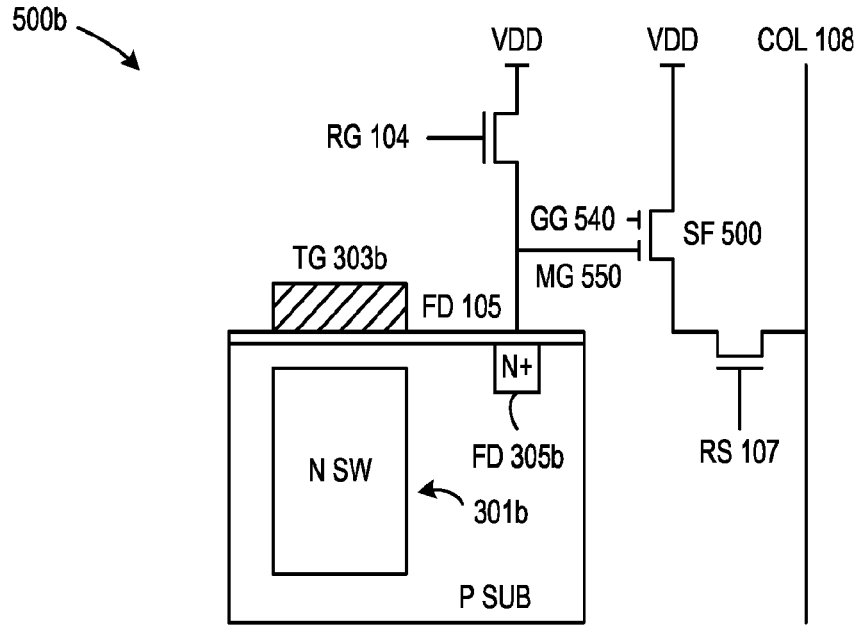
FIG. 5B schematically shows a cross-sectional views of an exemplary pixel that incorporates the multigate SF shown in FIG. 5A in accordance with some embodiments of the present disclosure and a reset transistor.

FIGS. 5A and 5B show an alternative configuration, i.e., the guard gate 540 of the SF 500 of the pixel 500b is placed closer than the modulation gate 550 to the drain 520b instead of the source 520a, in accordance with some embodiments of the present disclosure. In an embodiment, the modulation gate 550 has a smaller area than the guard gate 540. This configuration has a similar benefit as that of the previous configuration depicted in FIG. 3B. The FD-referred conversion gain remains high due to the small modulation gate 550 and the 1/f noise is expected to be low, benefiting from the large total channel area owing to the existence of the guard gate 540. In an embodiment, the SF 200 in the pixels 300a and 300c can be replaced by the SF 500.

Figure 6A:
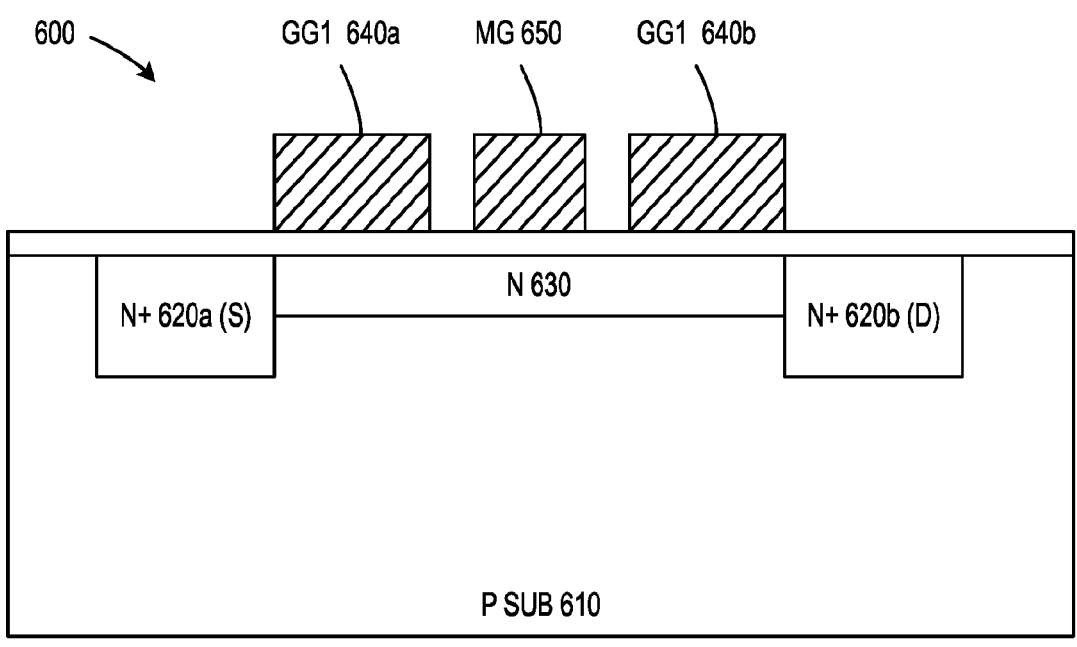
FIG. 6A schematically shows a cross-sectional view of an exemplary multigate source follower in accordance with some embodiments of the present disclosure.
Figure 6B:
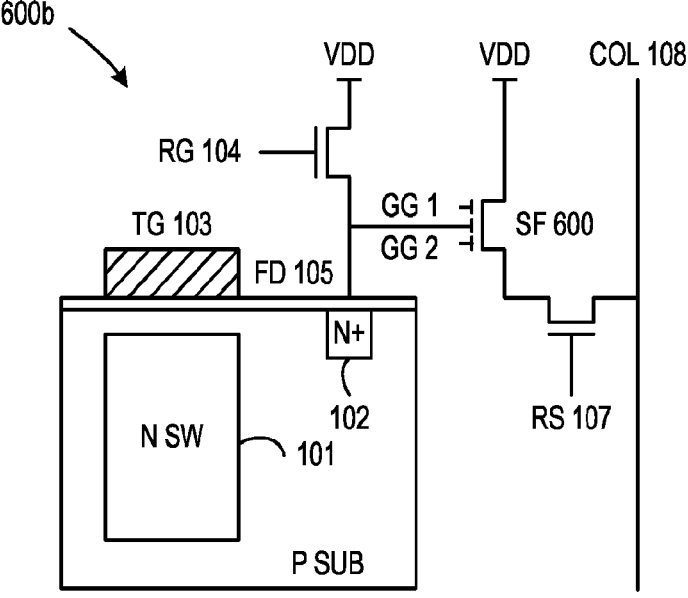
FIG. 6B schematically shows a cross-sectional views of an exemplary pixel that incorporates the multigate SF shown in FIG. 6A in accordance with some embodiments of the present disclosure and a reset transistor.

FIG. 6A depicts another alternative configuration, i.e., the SF 600 having two guard gates, e.g., GG1 640a and GG2 640b, while the modulation gate 650 being placed in between. A corresponding pixel 600b with such a triple-gate configuration is shown in FIG. 6B. The two guard gates GG1 640a and GG2 640b can be biased at $V_{GG1}$ and $V_{GG2}$, respectively, during SF operation. $V_{GG1}$ and $V_{GG2}$ are sufficiently high such that a channel, i.e., the channel 630, can be formed underneath the guard gates GG1 640a and GG2 640b. This configuration is expected to achieve even larger CG thus smaller FD-referred read noise compared to the aforementioned multigate SF with a single guard gate, e.g., the SF 200 and the SF 500, due to the reduction of both modulation gate-drain and modulation gate-source overlap capacitance.

In the example embodiments, the MGSFs, e.g., the SF 200, the SF 500 and the SF 600, are planar n-type buried channel semiconductor devices. In some other embodiments, the MGSFs can be vertical gate, p-type, or surface channel semiconductor devices (e.g., FIN FETs).

FIGS. 9A to 9D are schematic views of the SF 106, the SF 200, the SF 500 and SF 600, respectively, which are applied to shared readout pixels. FIGS. 10A to 10D show layouts of the pixels shown in FIGS. 9A to 9D, respectively. FIGS. 11A to 11D are operation potential-well diagrams of the SF 100, the SF 200, the SF 500 and the SF 600, respectively. FIGS. 12A to 12D show electrostatic potentials along channels of the SF 100, the SF 200, the SF 500 and the SF 600, respectively.

Figure 13:
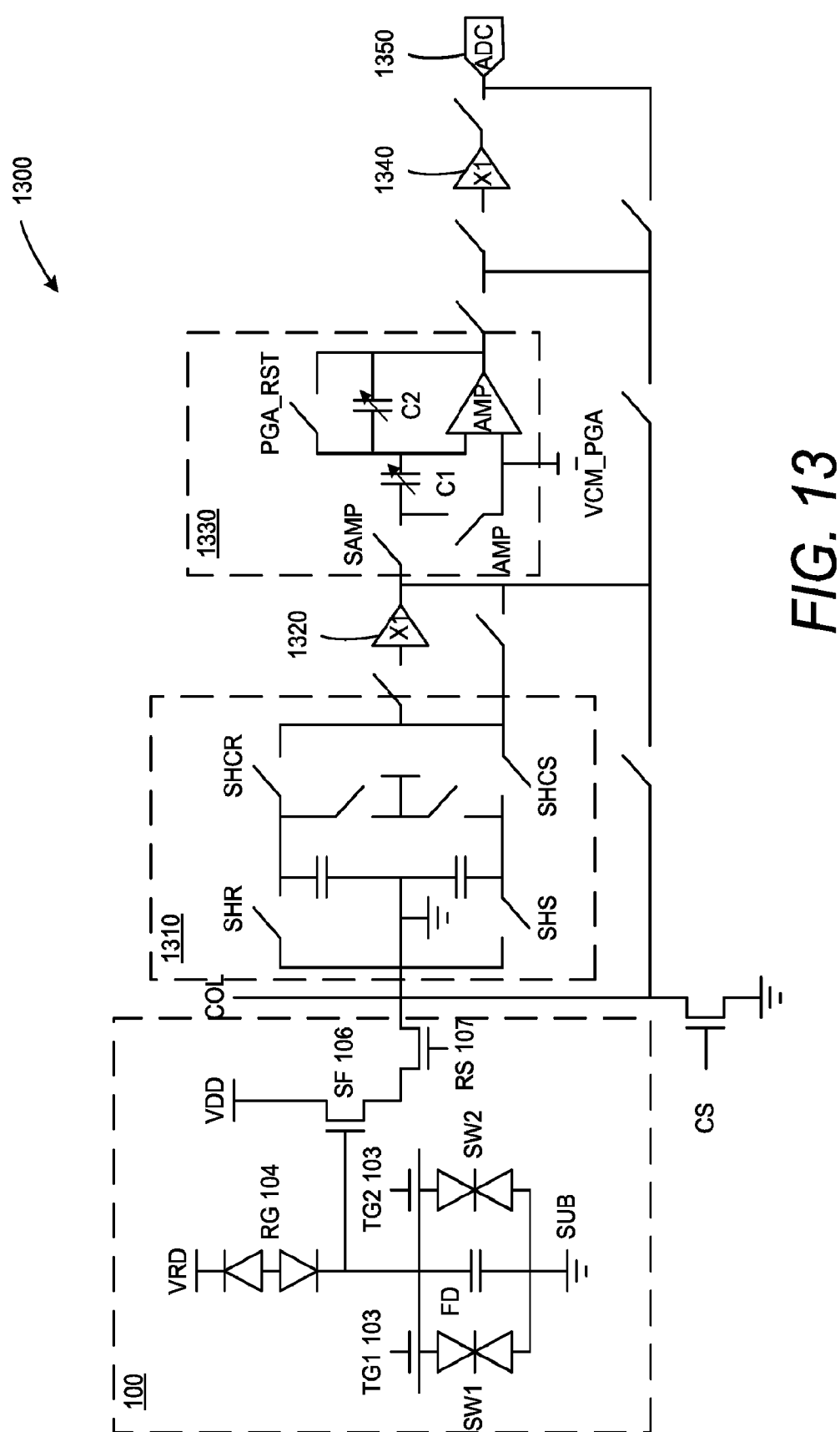
FIG. 13 shows the schematic of a readout chain.

FIG. 13 shows the schematic of a readout chain 1300. The pixel output from the row select transistor RS of the pixel 100 is sent to a correlated double sampling (CDS) circuit 1310, followed by a unity gain buffer 1320. A subsequent programmable gain amplifier (PGA) 1330 is utilized to amplify the signal from the unity gain buffer 1320, with a switchable analog gain that ranges from 2V/V to 40V/V. The output of the PGA 1330 is then sent to another unity-gain amplifier 1340, which drives the output pads so the signal can be read out off-chip. The signal is then digitized by an off-chip analog-to-digital converter (ADC) 1350. The gain of the PGA 1330 is set to be 10V/V during the 1/f noise testing.

Figure 14:
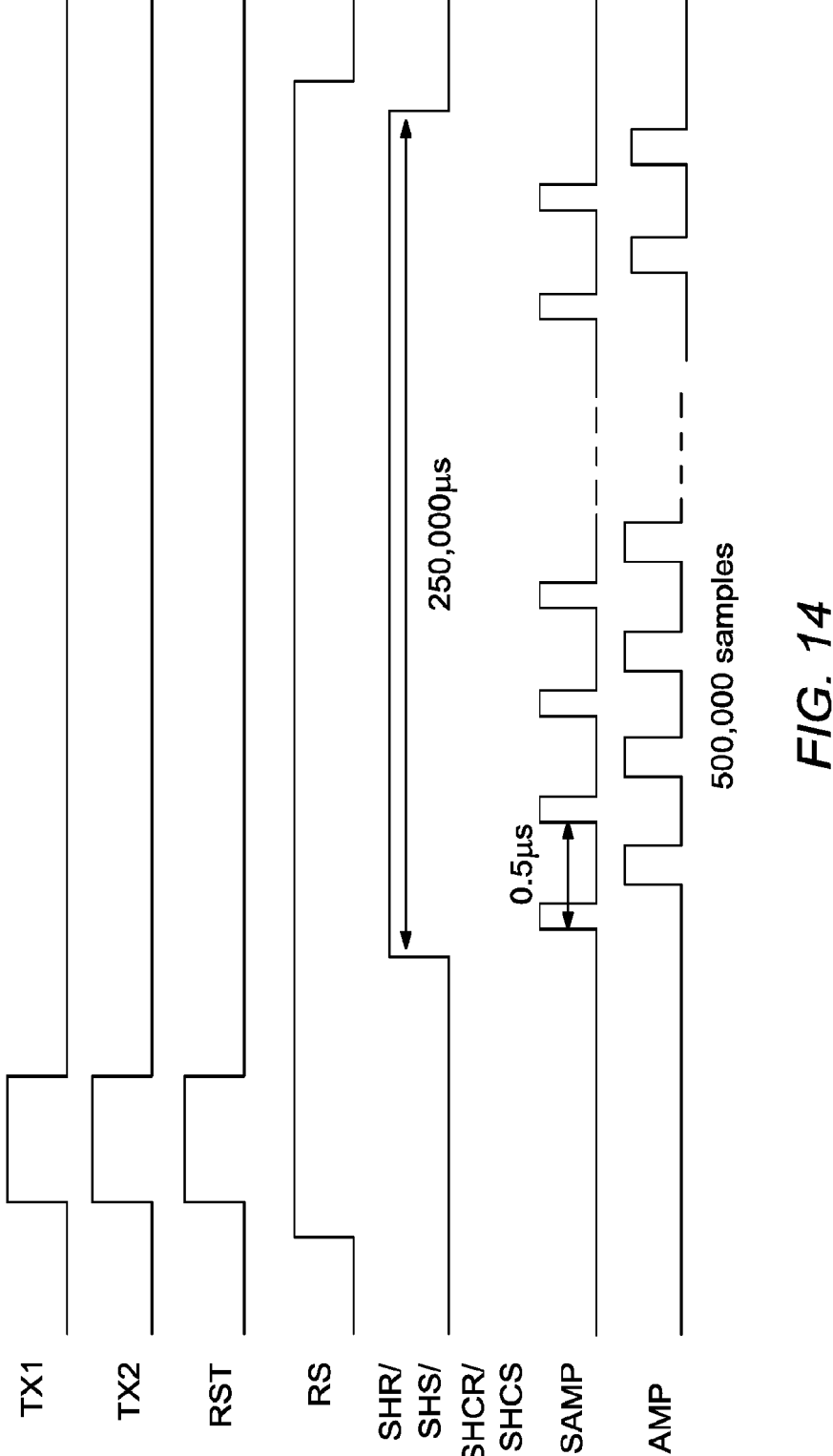
FIG. 14 shows the 1/f noise spectrum measurement timing diagram.

FIG. 14 shows the 1/f noise spectrum measurement timing diagram. First, the pixel 100 is reset by turning on both the transfer gate 103 and the reset gate 104. Then the PGA 1330 continuously samples the pixel output signal for 0.25 s with a sampling period of 0.5 $\mu$s. 500,000 samples are collected for each pixel. The data is digitized by the off-chip ADC 1350 and a data acquisition card saves the digitized data in a PC memory. The fast Fourier transform (FFT) algorithm was used to convert the data from the time domain to the frequency domain. A noise spectrum can thus be constructed.

Figures 15A, 15B:
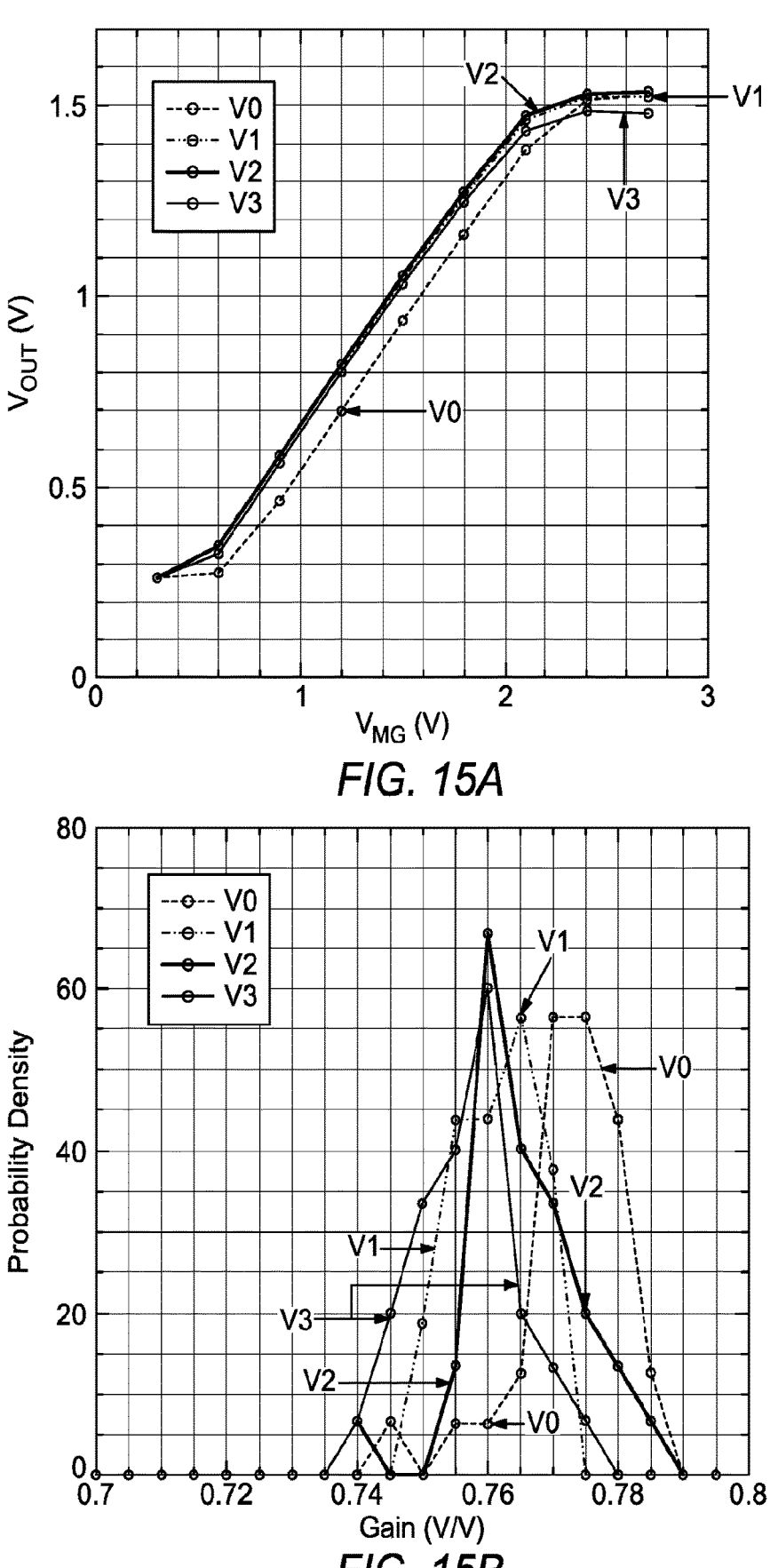
FIGS. 15A and 15B show the gain measurement results for 4 types of SFs.

FIGS. 15A and 15B show the gain measurement results for 4 types of SFs, e.g., the SF 100, the SF 200, the SF 500, and the SF 600. FIG. 15A shows the measured average of transfer curves from 32 SFs of each type. The guard gate (GG) is biased at a DC voltage of 2.5V for the multigate SFs (MGSF), i.e., the SF 200, the SF 500 and the SF 600. The conventional MOSFET SF, i.e., the SF 100, and the MGSF configurations show similar transfer characteristics. The SF gain can be extracted by measuring the slope of the linear region of the transfer curve. Although the gain of the V0 SF, i.e., the SF 100, is slightly higher (e.g., 0.78), the gain of the MGSFs is similar (e.g., 0.76 for V1 (i.e., the SF 200), V3

(i.e., the SF 600), and 0.77 for V2 (i.e., the SF 500)). The gain generally matches the TCAD simulation result, although it is 9% smaller, possibly due to the discrepancy between the process flow used in simulation and fabrication. The output voltage of MGSFs is higher than that of the V0 SF, due to the guard gate (GG) biased at a slightly higher voltage lowering the threshold voltage of MGSFs. The extracted SF gain and the measured gain are summarized in Table 1 as follows.

TABLE 1-A

SUMMARY OF EXTRACTION RESULTS FROM TCAD SIMULATION AND THE MEASURED SF GAIN

| SF Type | V0 SF | MGSF V1 | MGSF V2 | MGSF V3 |
|---|---|---|---|---|
| Total Gate Area | 0.083 $\mu m^2$ | 0.083 $\mu m^2$ | 0.083 $\mu m^2$ | 1.113 $\mu m^2$ |
| $C_{FD}$ | 0.278 fF | 0.229 fF | 0.223 fF | 0.226 fF |
| CG@FD | 579.1 | 699.7 | 716.2 | 708.7 |
| SF Gain | 0.85 | 0.83 | 0.84 | 0.83 |
| CG@SF Source | 490.7 | 578.7 | 598.1 | 588.1 |
| CG Improvement | N/A | +18% | +22% | +20% |
| Measured SF Gain | 0.78 | 0.76 | 0.77 | 0.76 |
| Estimated Read Noise (rms) | $0.38e^-$ | $0.17e^-$ | $0.17e^-$ | $0.16e^-$ |

FIG. 15B shows the histograms of the measured gain for all SFs. The MGSFs have similar gain variations as the conventional V0 SF. Normal SF operation is maintained for MGSFs with the extra guard gate.

Figure 16B:
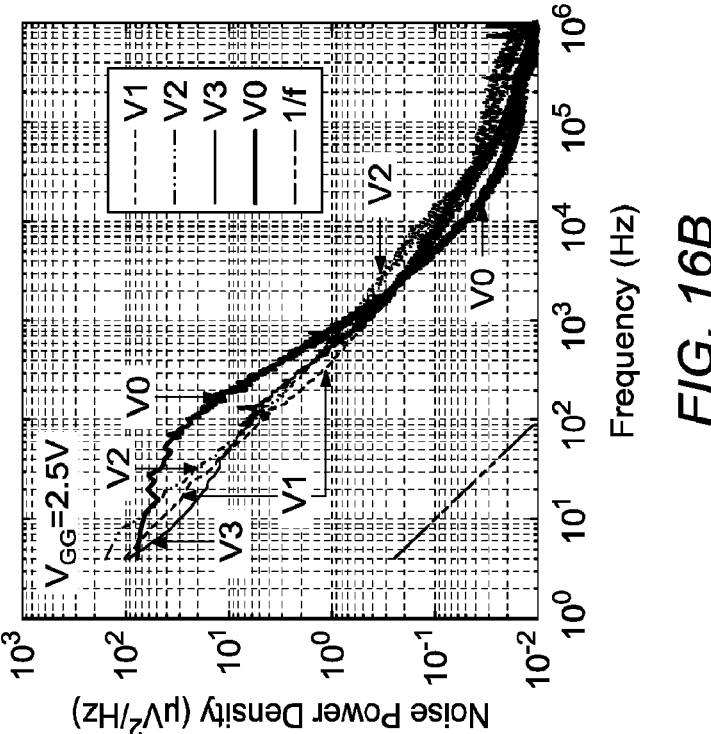
FIGS. 16A and 16B show the input-referred noise power spectra for 4 types of SFs.
Figure 16A:
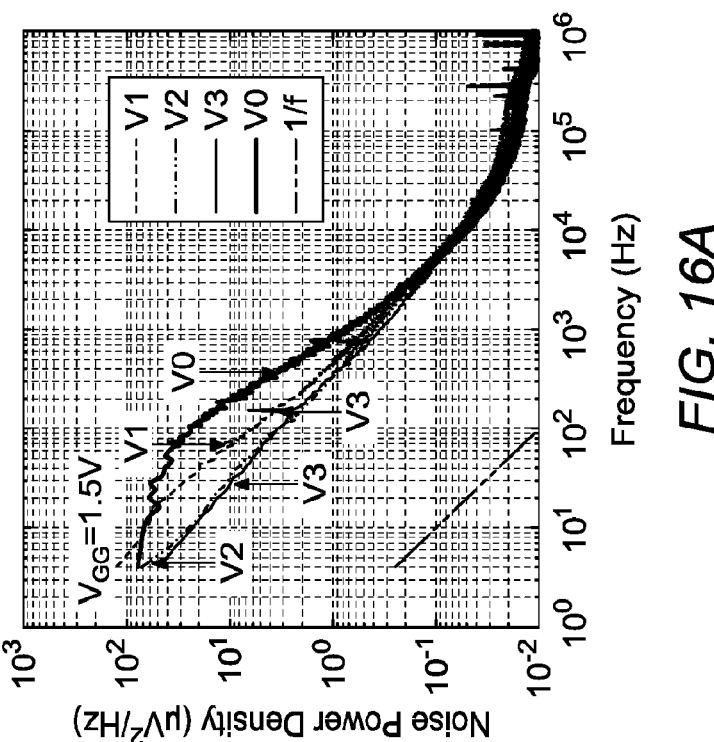

FIGS. 16A and 16B show the input-referred noise power spectra for 4 types of SFs, e.g., the SF 100, the SF 200, the SF 500, and the SF 600. Each curve is an average of the results from 32 devices. The 1/f trend is also shown using the dashed line as a reference. The bias current for all SFs is 1 μA. FIG. 16A shows that the MGSFs have lower noise compared to the V0 SF when the guard gate (GG) is biased at 1.5V. This indicates that splitting a larger SF gate into a smaller modulation gate (MG) plus a guard gate (GG) seems to reduce the overall 1/f noise—a surprising result since nominally one might expect similar 1/f noise power for devices with the same total gate area.

Also noteworthy is the apparent change in exponent α in the 1/f$^\alpha$ dependence where a is close to unity in the V2 and V3 MGSF configurations, but α≈1.5 for the "normal" V0 SF configuration, possibly indicating a change in underlying physical mechanism for the noise. (The exponent is α≈1.2 for the V1 configuration.) It might be further speculated that since the exponent changes mostly for V2 and V3, that the mechanism may be related to the drain (pinchoff) end of the MOSFET.

The results show the same trend when the guard gate (GG) is biased at 2.5V as shown in FIG. 16B. It is observed that the variation of the individual noise spectrum among all 32 SFs from each SF type is relatively large (about an order of magnitude), probably due to the small gate size and thus relatively large variations in geometry, doping and scattering center distribution during fabrication. In the high-frequency region, the noise spectrum flattens out because of the white noise (e.g., thermal noise). Correlated multiple sampling (CMS) may be utilized to suppress the high-frequency noise.

Figures 17A, 17B, 17C:
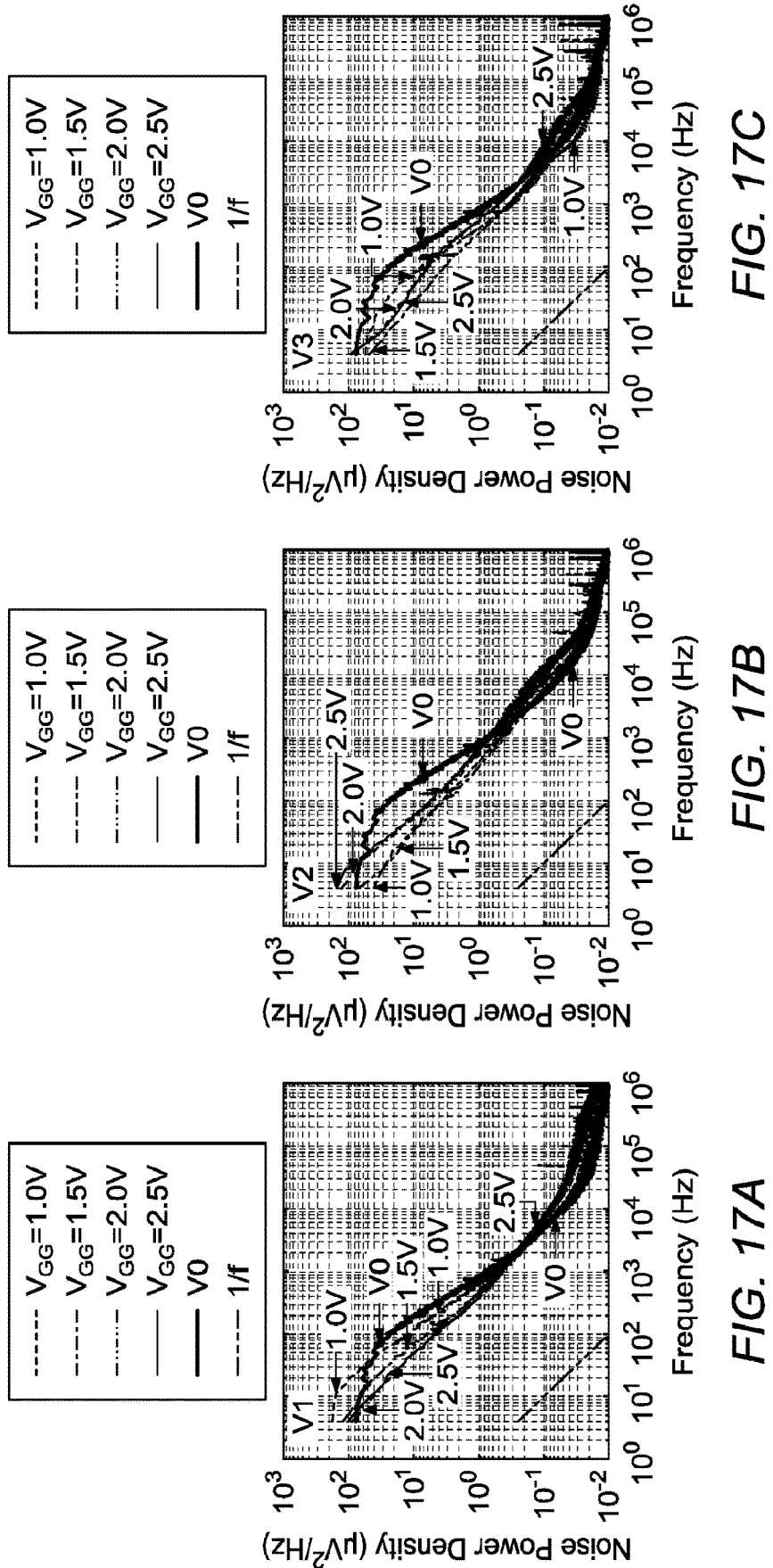
FIGS. 17A to 17C illustrate the impact of the guard gate (GG) bias voltage VGG.

FIGS. 17A to 17C illustrate the impact of the guard gate (GG) bias voltage VGG. For buried-channel SFs, the height of the potential barrier between the channel and the Si—SiO$_2$ interface changes since the surface potential increases monotonically from the source to the drain. Due to the higher bias on the drain end, the potential barrier is higher on the drain end, leading to better shielding of the interface.

Therefore, the guard gate (GG) may have different impact on the noise when placed on the drain end or the source end.

FIG. 17A shows the input-referred noise spectra of MGSF V1, e.g., the SF 200, at different guard gate (GG) bias voltages, e.g., 1.0V, 1.5V, 2.0V, and 2.5V. The 1/f noise decreases when the guard gate (GG) is biased at a higher voltage. It indicates that the 1/f noise spectrum can be modulated by the guard gate (GG) bias voltage. When the guard gate (GG) (closer to the source end), e.g., the SF 200, is biased at a higher voltage, the potential barrier between the channel and the Si—SiO$_2$ interface will be lowered and intuitively the noise will be higher due to weaker shielding. However, the observed noise is lower at higher VGG, which indicates that there might be another mechanism other than shielding. For example, higher VGG may lead to more inversion charge thus less charge number variation or less noise.

For different versions of MGSF, the influence of the guard gate (GG) bias is different. As shown in FIG. 17B, for MGSF V2, e.g., the SF 500, the 1/f noise decreases when the guard gate (GG) is biased at a lower voltage, which is the opposite compared to MGSF V1, e.g., the SF 200. This is probably because the lower the guard gate (GG) (closer to the drain end) voltage, the potential barrier seen by the buried channel is higher, thus the 1/f noise is smaller.

The input-referred noise spectra of MGSF V3, e.g., the SF 600, at different guard gate (GG) bias voltages is shown in FIG. 17C. Similarly, the 1/f noise is VGG dependent. However, no clear trend is observed, probably because there are guard gates (GG) on both the drain end and the source end, which combines the two opposite noise effects observed in FIGS. 17A and 17B.

To achieve the lowest noise, the optimum guard gate (GG) bias voltage should be used. Overall, compared to the MGSFs with different guard gate (GG) bias voltage VGG, the V0 SF has a similar or higher 1/f noise.

Figures 7A, 7B:
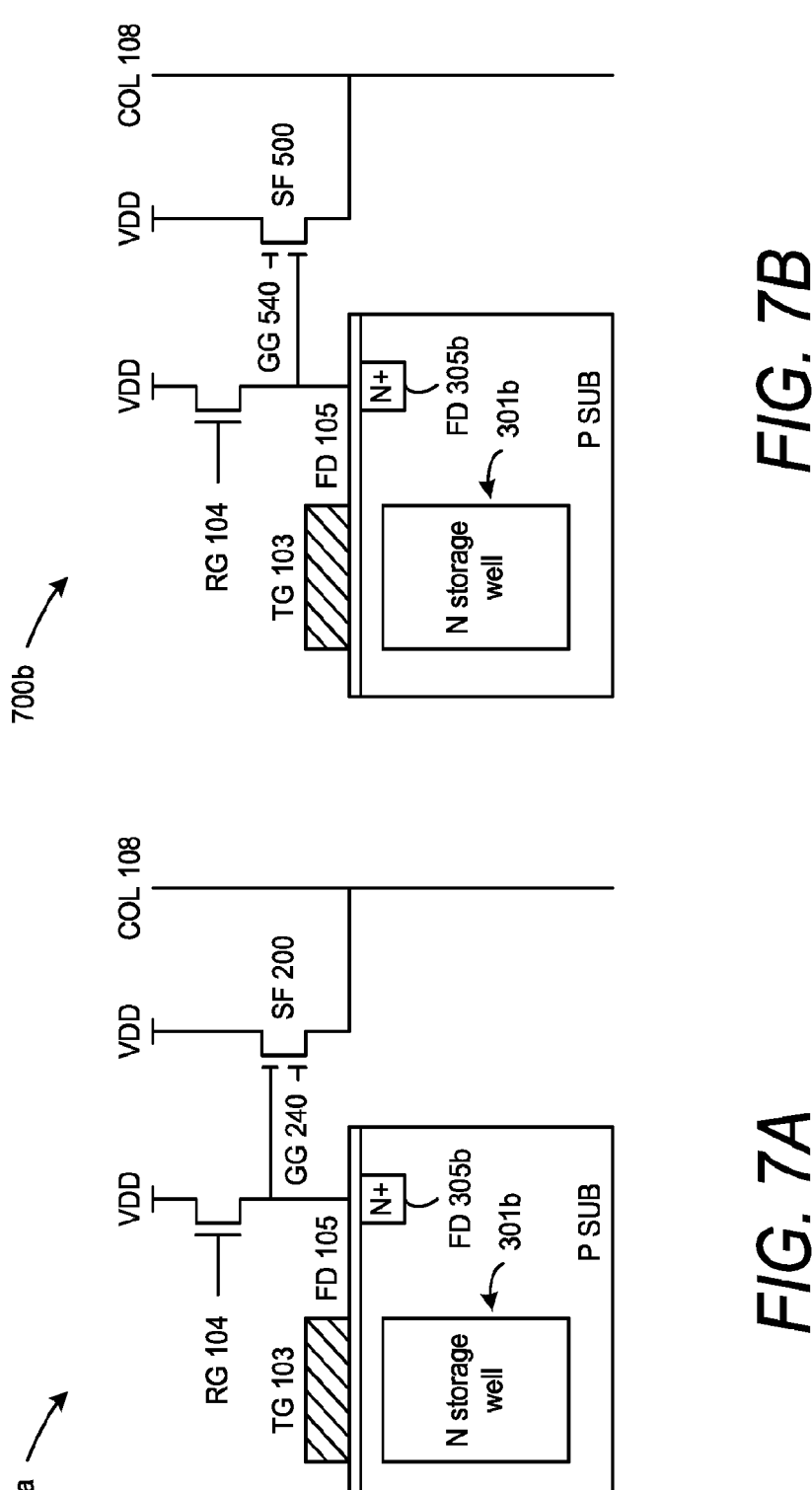
FIGS. 7A and 7B schematically show a cross-sectional views of exemplary pixels that each incorporates a multigate SF in accordance with some embodiments of the present disclosure, without a row select transistor.

In another embodiment, further simplified pixels 700a and 700b with the guard gate directly functioning as the row select are shown in FIGS. 7A and 7B, respectively, by connecting the source 320a/520a of the SF 200/500 to the column bit line 108 directly. When the row is disconnected, the guard gate 240/540 is biased at a low voltage (e.g., 0V). When the row is selected, the guard gate 240/540 is biased to a high voltage (e.g., 2.5V) to allow current flow. This configuration can save pixel area by eliminating the row select transistor (RS) 107.

Figure 8:
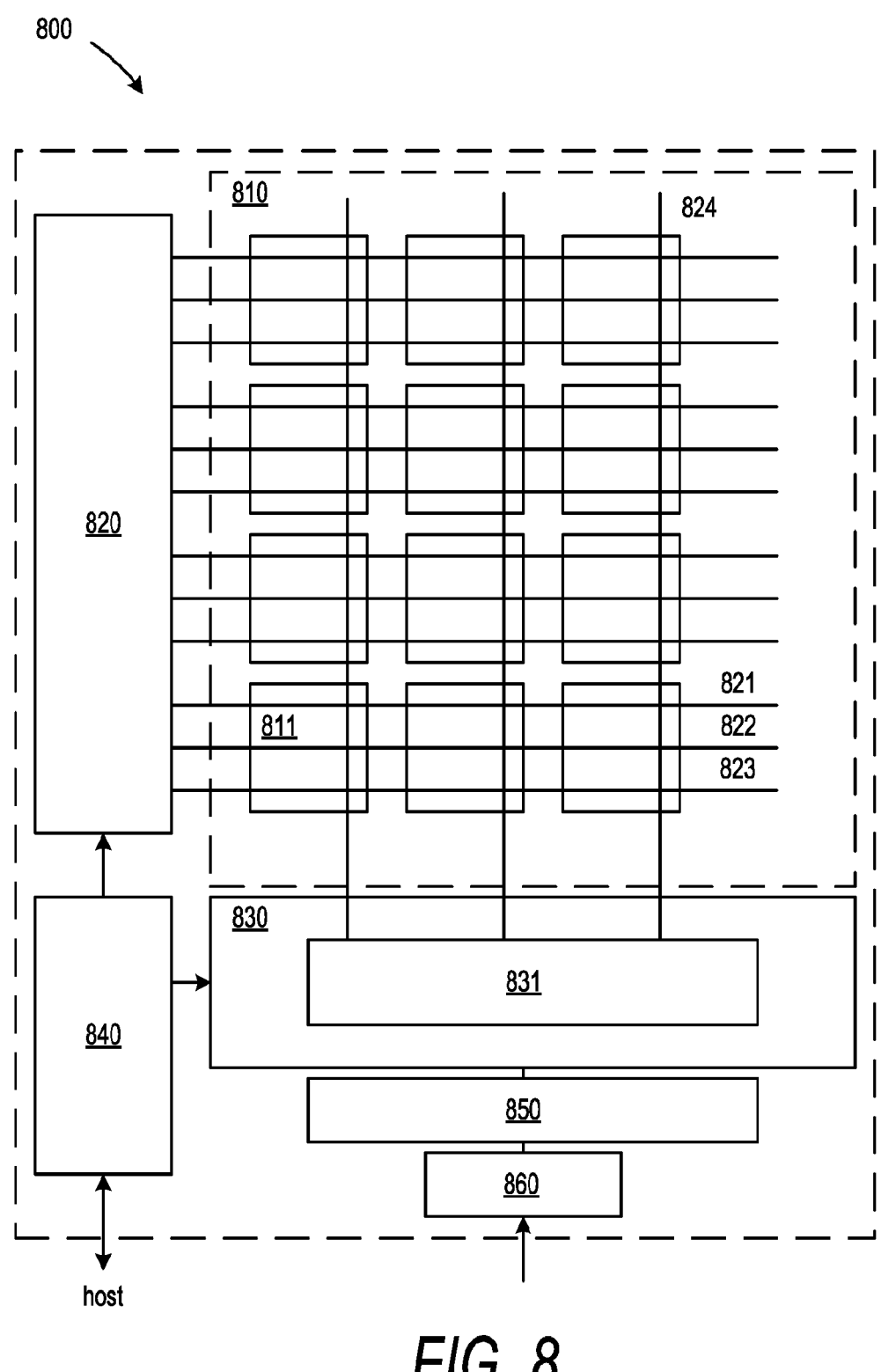
FIG. 8 is a functional block diagram of an exemplary image sensor that may be used to implement embodiments in accordance with some embodiments of the present disclosure, such as embodiments comprising pixels that employ a multigate SF in accordance with those described hereinabove in connection with FIGS. 2, 3A-3C, 5A, 5B, 6A, 6B, 7A, and 7B.
Figures 10A, 10B, 10C, 10D:
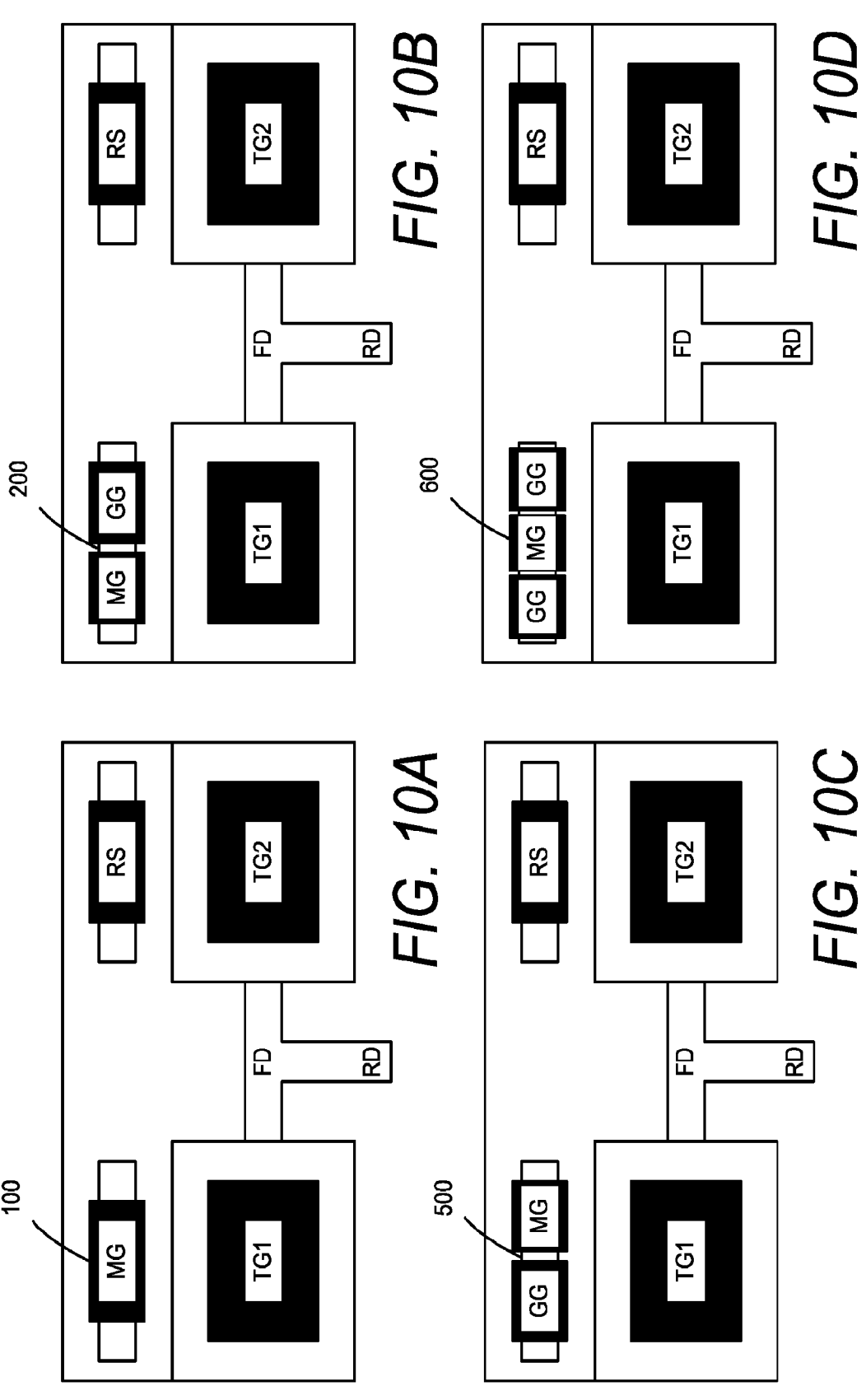
FIGS. 10A to 10D show layouts of the pixels shown in FIGS. 9A to 9D, respectively.
Figures 11A, 11B, 11C, 11D:
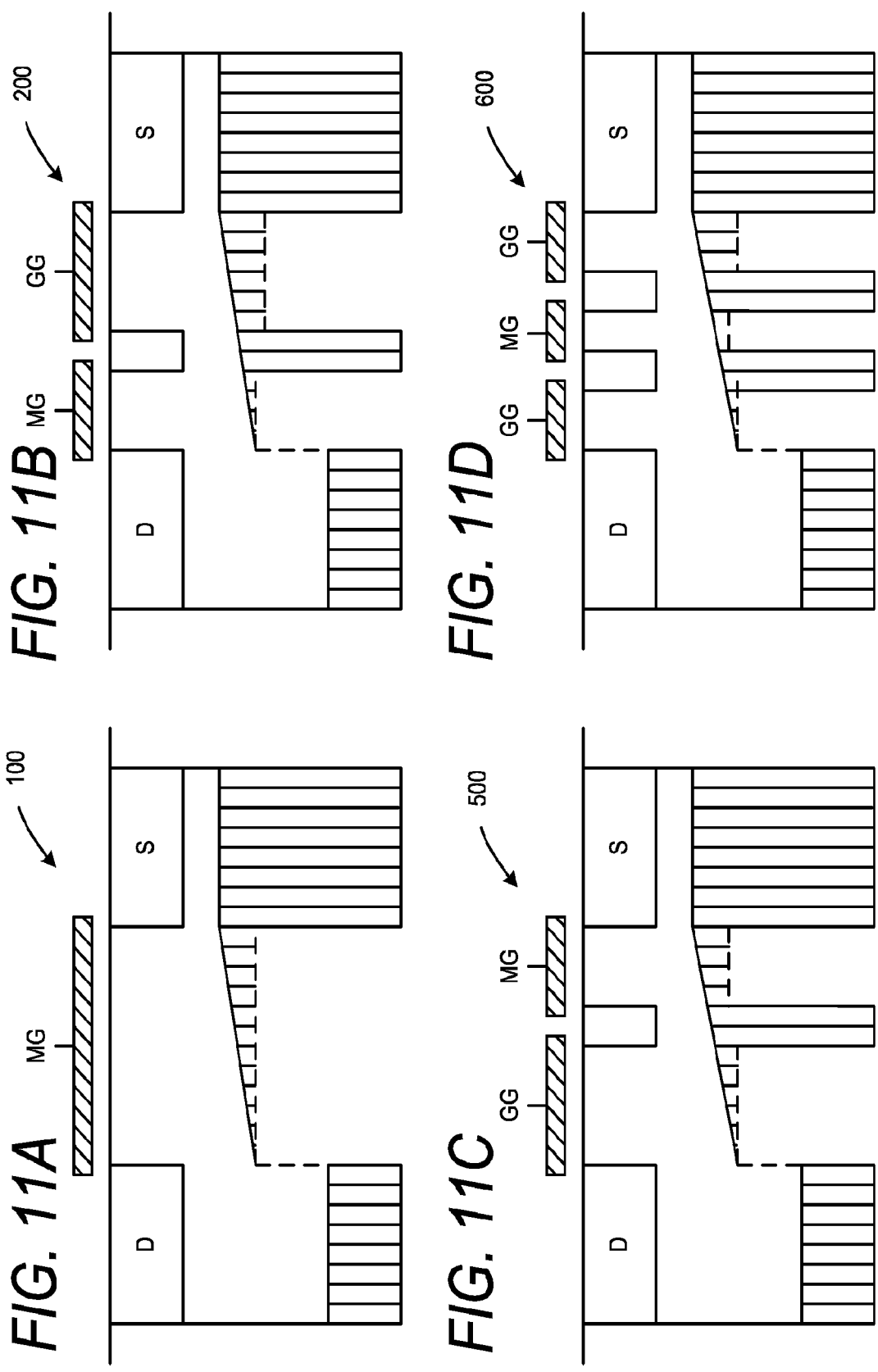
FIGS. 11A to 11D are operation potential-well diagrams of the SFs shown in FIGS. 1, 2, 5A, and 6A, respectively.

FIG. 8 is a functional block diagram of an exemplary image sensor 800 that may be used to implement embodiments in accordance with some embodiments of the present disclosure, such as embodiments comprising pixels that employ a multigate SF in accordance with those described hereinabove in connection with FIGS. 2, 3A-3C, 5A, 5B, 6A, 6B, 7A and 7B.

A pixel array 810 can include a large number of pixels 811 (e.g., the pixel 300a, 300b, 300c, 500b, 600b, 700a, or 700b) arranged in an M×N (e.g., 4×3) array. A row addressing and row driver circuitry 820 generates transfer gate (TG) control signals on lines 821, row select (RS) signals on lines 822, and reset drain (RD) control signals on lines 823. A column readout circuitry 830 can include analog-to-digital (ADC) circuitry 831 for sampling and digitizing output values readout from the pixel array 810. In an embodiment, the ADC circuitry 831 can be configured such that the column readout circuitry 830 associated with each column bus 824 can have its respective ADC circuitry. A timing and control circuitry 840 controls the row addressing and row driver circuitry 820 and the column readout circuitry 830. For example, the timing and control circuitry 840 controls the row addressing and row driver circuitry 820 to select the appropriate row for readout, and provide timing control signals in accordance with rolling shutter readout or global shutter readout. The timing and control circuitry 840 can also communicate with a host (e.g., a processor associated with a system comprising the image sensor). Signals on the column buses 824 are sampled and digitized by the ADC circuitry 831, and the digitized pixel values provided by the ADC circuitry 831 can be provided to a line buffer 850, which stores the digitalized signals temporarily for use by an image processor 860. The image processor 860 can process the digitalized signals held in the line buffer 850 to produce output image data that may be provided to a device external to the image sensor 800.

In some other embodiment, a camera, e.g., an ultra-low light camera, can utilize an MGSF in at least one of the pixels, e.g., the pixel 300a, 300b, 300c, 500b, 600b, 700a, or 700b, of an image sensor.

As may be appreciated, there are many possible alternative implementations of an image sensor architecture that may embody high conversion gain buried-well vertically-pinned pixels in accordance with some embodiments of the present disclosure. According to some embodiments of the present disclosure, the MGSFs, e.g., the SF 200, the SF 500, and the SF 600 can also applied to other amplifiers wherein input capacitance needs to be minimized as well as 1/f output voltage or current noise, including the source-follower configurations and other preamplifier configurations, as those skilled in the art know.

Thus, the foregoing discussion discloses and describes merely exemplary embodiments of the present inventions. As will be understood by those skilled in the art, the present invention may be embodied in other specific forms without departing from the spirit or essential characteristics thereof. Accordingly, the disclosure of the present inventions is intended to be illustrative, but not limiting of the scope of the inventions, as well as other claims. The disclosure, including any readily discernible variants of the teachings herein, defines, in part, the scope of the foregoing claim terminology such that no inventive subject matter is dedicated to the public.

Embodiments of the present disclosure may also be as set forth in the following parentheticals.

(1) An image sensor including one or more pixels, at least one of which comprises: a semiconductor substrate; a floating diffusion formed in the semiconductor substrate; a transfer gate configured to selectively cause transfer of photo-charges stored in the pixel to the floating diffusion; and a multigate source follower including a channel, a source and a drain coupled by the channel, a modulation gate formed over the channel and coupled to the floating diffusion, and a first guard gate formed over the channel and spaced apart from the modulation gate.

(2) The image sensor of (1), wherein the first guard gate is located closer than the modulation gate to the source.

(3) The image sensor of (1), wherein the first guard gate is located closer than the modulation gate to the drain.

(4) The image sensor of (1), wherein the modulation gate has a smaller area than the first guard gate.

(5) The image sensor of (1), wherein the multigate source follower further includes a second guard gate formed over the channel and spaced apart from the modulation gate, and the modulation gate is located between the first guard gate and the second guard gate.

(6) The image sensor of (5), wherein the modulation gate has a smaller area than the second guard gate.

(7) The image sensor of (1), wherein the multigate source follower is buried-channel.

(8) The image sensor of (1), wherein the multigate source follower is surface-channel.

(9) The image sensor of (1), wherein the pixel further includes a gated reset transistor coupled to the floating diffusion.

(10) The image sensor of (1), wherein the pixel further includes a gateless reset diode coupled to the floating diffusion.

(11) The image sensor of (1), wherein the image sensor is a quanta image sensor (QIS).

(12) The image sensor of (1), wherein the image sensor is a complementary metal-oxide-semiconductor (CMOS) active pixel image sensor.

(13) The image sensor of (1), being included in a camera.

(14) The image sensor of (1), wherein the first guard gate is spaced apart from the modulation gate at a distance less than 0.05 μm.

(15) The image sensor of (1), wherein the first guard gate is spaced apart from the modulation gate at a distance less than 5×a mean free path of an electron in a channel under normal operating conditions.

(16) The image sensor of (1), wherein the pixel further includes a pinned photodiode configured for storing the photo-charges.

(17) A method, comprising: providing an image sensor including one or more pixels, at least one of which comprises: a semiconductor substrate; a floating diffusion formed in the semiconductor substrate; a transfer gate configured to selectively cause transfer of photo-charges stored in the pixel to the floating diffusion, and a multigate source follower including a channel, a source and a drain coupled by the channel, a modulation gate formed over the channel and coupled to the floating diffusion, and a first guard gate formed over the channel and spaced apart from the modulation gate; and connecting the source of the multigate source follower to a bit line directly.

(18) A multigate source follower for at least one pixel of an image sensor, the source follower comprising: a semiconductor substrate; a channel formed in the semiconductor substrate; a source and a drain formed in the semiconductor substrate and coupled by the channel; a modulation gate formed over the channel; and a first guard gate formed over the channel and spaced apart from the modulation gate.

(19) The multigate source follower of (18), wherein the modulation gate has a smaller area than the first guard gate.

(20) The multigate source follower of (18), further comprising a second guard gate formed over the channel and spaced apart from the modulation gate, wherein the modulation gate is located between the first guard gate and the second guard gate.

The invention claimed is:
1. An image sensor including one or more pixels, at least one of which comprises:
a semiconductor substrate;
a floating diffusion formed in the semiconductor substrate;
a transfer gate configured to selectively cause transfer of photo-charges stored in the pixel to the floating diffusion; and
a multigate source follower including a channel, a source and a drain coupled by the channel, a modulation gate formed over the channel and coupled to the floating diffusion, and a first guard gate formed over the channel and spaced apart from the modulation gate.

2. The image sensor of claim 1, wherein the first guard gate is located closer than the modulation gate to the source.

3. The image sensor of claim 1, wherein the first guard gate is located closer than the modulation gate to the drain.

4. The image sensor of claim 1, wherein the modulation gate has a smaller area than the first guard gate.

5. The image sensor of claim 1, wherein the multigate source follower further includes a second guard gate formed over the channel and spaced apart from the modulation gate, and the modulation gate is located between the first guard gate and the second guard gate.

6. The image sensor of claim 5, wherein the modulation gate has a smaller area than the second guard gate.

7. The image sensor of claim 1, wherein the multigate source follower is buried-channel.

8. The image sensor of claim 1, wherein the multigate source follower is surface-channel.

9. The image sensor of claim 1, wherein the pixel further includes a gated reset transistor coupled to the floating diffusion.

10. The image sensor of claim 1, wherein the pixel further includes a gateless reset diode coupled to the floating diffusion.

11. The image sensor of claim 1, wherein the image sensor is a quanta image sensor (QIS).

12. The image sensor of claim 1, wherein the image sensor is a complementary metal-oxide-semiconductor (CMOS) active pixel image sensor.

13. The image sensor of claim 1, being included in a camera.

14. The image sensor of claim 1, wherein the first guard gate is spaced apart from the modulation gate at a distance less than 0.05 μm.

15. The image sensor of claim 1, wherein the first guard gate is spaced apart from the modulation gate at a distance less than 5×a mean free path of an electron in a channel under normal operating conditions.

16. The image sensor of claim 1, wherein the pixel further includes a pinned photodiode configured for storing the photo-charges.

17. A method, comprising:

providing an image sensor including one or more pixels, at least one of which comprises:

a semiconductor substrate;

a floating diffusion formed in the semiconductor substrate;

a transfer gate configured to selectively cause transfer of photo-charges stored in the pixel to the floating diffusion; and a multigate source follower including a channel, a source and a drain coupled by the channel, a modulation gate formed over the channel and coupled to the floating diffusion, and a first guard gate formed over the channel and spaced apart from the modulation gate; and connecting the source of the multigate source follower to a bit line directly.

18. A multigate source follower for at least one pixel of an image sensor, the source follower comprising: a semiconductor substrate; a channel formed in the semiconductor substrate; a source and a drain formed in the semiconductor substrate and coupled by the channel; a modulation gate formed over the channel; and a first guard gate formed over the channel and spaced apart from the modulation gate.

19. The multigate source follower of claim 18, wherein the modulation gate has a smaller area than the first guard gate.

20. The multigate source follower of claim 18, further comprising a second guard gate formed over the channel and spaced apart from the modulation gate, wherein the modulation gate is located between the first guard gate and the second guard gate.

\* \* \* \* \*